United States Patent
Ballantyne et al.

(10) Patent No.: US 12,284,461 B2
(45) Date of Patent: Apr. 22, 2025

(54) SYSTEMS, DEVICES, AND METHODS FOR SYNCHRONIZING DATA FROM ASYNCHRONOUS SOURCES

(71) Applicant: Geotab Inc., Oakville (CA)

(72) Inventors: William John Ballantyne, Aurora (CA); Javed Siddique, York (CA); Willem Petersen, Elmira (CA)

(73) Assignee: Geotab Inc., Oakville (CA)

( * ) Notice: Subject to any disclaimer, the term of this patent is extended or adjusted under 35 U.S.C. 154(b) by 0 days.

(21) Appl. No.: 18/420,976

(22) Filed: Jan. 24, 2024

(65) Prior Publication Data

US 2024/0275917 A1 Aug. 15, 2024

Related U.S. Application Data

(60) Provisional application No. 63/444,434, filed on Feb. 9, 2023.

(51) Int. Cl.
*H04N 7/01* (2006.01)
*H04N 5/04* (2006.01)

(52) U.S. Cl.
CPC ......... *H04N 7/0127* (2013.01); *H04N 7/0135* (2013.01)

(58) Field of Classification Search
CPC ...... H04N 7/0127; H04N 7/0135; H04N 7/01; H04N 5/04
USPC ....... 348/441, 458, 459, 500, 537, 538, 464; 340/3.2; 375/354, 355
See application file for complete search history.

(56) References Cited

U.S. PATENT DOCUMENTS

| | | | |
|---|---|---|---|
| 8,458,524 B2 | 6/2013 | Shao et al. | |
| 8,781,733 B2 | 7/2014 | Staehlin et al. | |
| 8,791,806 B2 | 7/2014 | Granruth | |
| 8,810,726 B2 * | 8/2014 | Diggins | H04N 7/0105 348/459 |
| 8,930,072 B1 | 1/2015 | Lambert et al. | |
| 8,952,819 B2 | 2/2015 | Nemat-Nasser | |
| 9,240,080 B2 | 1/2016 | Lambert et al. | |
| 9,280,857 B2 | 3/2016 | Lambert et al. | |
| 9,292,980 B2 | 3/2016 | Cook et al. | |
| 9,298,575 B2 | 3/2016 | Tamari et al. | |
| 9,344,683 B1 | 5/2016 | Nemat-Nasser et al. | |
| 9,358,926 B2 | 6/2016 | Lambert et al. | |
| 9,389,147 B1 | 7/2016 | Lambert et al. | |
| 9,405,970 B2 | 8/2016 | Israel et al. | |
| 9,472,083 B2 | 10/2016 | Nemat-Nasser | |
| 9,646,651 B1 | 5/2017 | Richardson | |
| 9,761,063 B2 | 9/2017 | Lambert et al. | |

(Continued)

*Primary Examiner* — Sherrie Hsia
(74) *Attorney, Agent, or Firm* — Wolf, Greenfield & Sacks, P.C.

(57) ABSTRACT

A synchronized data set is generated from multiple asynchronous data sets. An interpolated data set is generated for each asynchronous data set, at a higher data rate than recorded data rates for the asynchronous data sets. The interpolated data for each data set is then sampled at a lower data rate which is common to all the interpolated data sets. The sampled data points are synchronized between the different data sets, such that the sampled data points represent a synchronized data set. Input telematic data can be reduced to inflection points in the telematic data, and interpolation and sampling of asynchronous data sets can be limited to threshold time periods around the inflection points.

16 Claims, 12 Drawing Sheets

(56) References Cited

U.S. PATENT DOCUMENTS

| | | |
|---|---|---|
| 9,792,740 B2 | 10/2017 | Lambert et al. |
| 9,996,756 B2 | 6/2018 | Hoye et al. |
| 10,152,870 B1 | 12/2018 | Williams et al. |
| 10,155,445 B2 | 12/2018 | Nemat-Nasser |
| 10,166,934 B2 | 1/2019 | Nemat-Nasser et al. |
| 10,204,159 B2 | 2/2019 | Angel et al. |
| 10,276,212 B2 | 4/2019 | Richardson |
| 10,496,891 B2 | 12/2019 | Sai |
| 10,686,976 B2 | 6/2020 | Nalepka et al. |
| 10,785,524 B1 | 9/2020 | Morris |
| 10,885,360 B1 | 1/2021 | Daniels et al. |
| 11,010,640 B1 | 5/2021 | Daniels |
| 11,080,568 B2 | 8/2021 | ElHattab et al. |
| 11,157,723 B1 | 10/2021 | Shah et al. |
| 11,310,549 B2 | 4/2022 | Morris |
| 11,336,867 B2 | 5/2022 | Meier et al. |
| 11,345,279 B2 | 5/2022 | Kopp |
| 11,356,605 B1 | 6/2022 | Shemet et al. |
| 11,452,062 B1 | 9/2022 | Fisher |
| 11,468,687 B2 | 10/2022 | Takami et al. |
| 11,494,921 B2 | 11/2022 | ElHattab et al. |
| 11,611,621 B2 | 3/2023 | ElHattab et al. |
| 11,659,060 B2 | 5/2023 | Davis et al. |
| 11,683,579 B1 | 6/2023 | Symons et al. |
| 11,688,211 B1 | 6/2023 | Calmer et al. |
| 11,736,312 B1 | 8/2023 | Xiao et al. |
| 11,758,096 B2 | 9/2023 | Shah et al. |
| 11,863,712 B1 | 1/2024 | Young et al. |
| 11,866,055 B1 | 1/2024 | Srinivasan et al. |
| 11,910,263 B2 | 2/2024 | Xu et al. |
| 11,917,040 B1 | 2/2024 | Mendez Rodriguez et al. |
| 11,930,082 B1 | 3/2024 | Singh et al. |
| 11,950,182 B2 | 4/2024 | Stojanovski et al. |
| 11,956,782 B2 | 4/2024 | Shilov et al. |
| 11,997,181 B1 | 5/2024 | Davis et al. |
| 12,058,562 B2 | 8/2024 | Khoryaev et al. |
| 12,063,505 B2 | 8/2024 | Guo et al. |
| 12,063,657 B2 | 8/2024 | Panteleev et al. |
| 12,089,278 B2 | 9/2024 | Wu et al. |
| 12,113,746 B2 | 10/2024 | Panteleev et al. |
| 2016/0343145 A1 | 11/2016 | Israel et al. |
| 2019/0041998 A1 | 2/2019 | Katz |
| 2020/0151611 A1 | 5/2020 | McGavran et al. |
| 2020/0207358 A1 | 7/2020 | Katz et al. |
| 2020/0216078 A1 | 7/2020 | Katz |
| 2020/0342230 A1 | 10/2020 | Tsai et al. |
| 2020/0342235 A1 | 10/2020 | Tsai et al. |
| 2021/0041259 A1 | 2/2021 | Filip et al. |
| 2021/0201051 A1 | 7/2021 | Deselaers et al. |
| 2021/0229673 A1 | 7/2021 | Singh et al. |
| 2021/0241000 A1 | 8/2021 | Pfeiffer et al. |
| 2021/0397908 A1 | 12/2021 | ElHattab et al. |
| 2021/0406587 A1 | 12/2021 | Mayer |
| 2021/0406610 A1 | 12/2021 | Moskalev et al. |
| 2022/0402521 A1 | 12/2022 | Hetang |
| 2023/0038842 A1 | 2/2023 | Yu et al. |
| 2024/0003749 A1 | 1/2024 | Lin et al. |
| 2024/0096139 A1 | 3/2024 | Mesde et al. |
| 2024/0098746 A1 | 3/2024 | Ye et al. |
| 2024/0146629 A1 | 5/2024 | Lloyd |

\* cited by examiner

SYSTEMS, DEVICES, AND METHODS FOR SYNCHRONIZING DATA FROM ASYNCHRONOUS SOURCES

CROSS-REFERENCE TO RELATED APPLICATIONS

This application claims priority under 35 U.S.C. § 119(e) to U.S. Provisional Application No. 63/444,434, entitled "SYSTEMS, DEVICES, AND METHODS FOR SYNCHRONIZING DATA FROM ASYNCHRONOUS SOURCES" and filed on Feb. 9, 2023, which is incorporated herein by reference in its entirety.

TECHNICAL FIELD

The present disclosure generally relates to systems, devices, and methods for synchronizing data, and in particular relates to synchronizing data from asynchronous sources.

BACKGROUND

Sensors have been developed which collect a variety of data during operation of vehicles. However, such sensors do not necessarily collect data at the same rate, and thus data from multiple sensors may not be synchronized. It is desirable to provide a means for synchronizing data from multiple asynchronous data sources.

SUMMARY

According a broad aspect, the present disclosure describes a method for synchronizing data, the method comprising: accessing input video data of a first data rate and input telematic data of at least a second data rate different from the first data rate; receiving an indication of a synchronized data rate; generating reduced telematic data, by selecting data points from the input telematic data for inclusion in the reduced telematic data, based on differences of the data points to iteratively-defined reference lines defined through portions of the input telematic data; generating interpolated video data by interpolating the input video data at the synchronized data rate for a threshold time period around each identified data point in the input telematic data; generating interpolated telematic data by interpolating the reduced telematic data at the synchronized data rate for the threshold time period around each identified data point in the input telematic data; and sampling the interpolated telematic data and the interpolated video data at the sample rate in the threshold time period.

Selecting data points from the input telematic data for inclusion in the reduced telematic data, based on differences of the data points to iteratively-defined reference lines defined through portions of the input telematic data, may comprise, for each data point of the input telematic data: determining a minimum difference between the data point and a corresponding reference line of the iteratively-defined reference lines, where the data point is included in the reduced telematic data if the minimum difference between the data point and the corresponding reference line exceeds a difference threshold.

Selecting data points from the input telematic data for inclusion in the reduced telematic data, based on differences of the data points to iteratively-defined reference lines defined through portions of the input telematic data, may comprise: defining a reference line through the input telematic data; identifying a data point of the input telematic data, where a minimum difference between the data point and the reference line is greater than a minimum difference between other data points and the reference line; and if the minimum difference between the data point and the reference line exceeds a difference threshold: selecting the data point for inclusion in the reduced telematic data; and defining new reference lines which intersect the sample point through the input telematic data. Selecting data points from the input telematic data for inclusion in the reduced telematic data, based on differences of the data points to iteratively-defined reference lines defined through portions of the input telematic data, may further comprise: defining an additional reference line through the input telematic data which intersects a data point previously selected for inclusion in the reduced telematic data; identifying an additional data point of the input telematic data, where a minimum difference between the additional data point and the additional reference line is greater than a minimum difference between other data points and the additional reference line; and if the minimum difference between the additional data point and the additional reference line exceeds the difference threshold: select the additional data point for inclusion in the reduced telematic data.

The input telematic data may include location data for a vehicle, and selecting data points from the input telematic data for inclusion in the reduced telematic data, based on differences of the data points to iteratively-defined reference lines defined through portions of the input telematic data may comprise: selecting data points from the input telematic data for inclusion in the reduced telematic data, based on physical distances between positions represented by the data points to iteratively-defined reference lines defined through portions of the location data.

The input telematic data may include speed data for a vehicle, and selecting data points from the input telematic data for inclusion in the reduced telematic data, based on differences of the data points to iteratively-defined reference lines defined through portions of the input telematic data may comprise: selecting data points from the input telematic data for inclusion in the reduced telematic data, based on differences in speed between speeds represented by the data points to iteratively-defined reference lines defined through portions of the speed data.

The input telematic data may include acceleration data for a vehicle, and selecting data points from the input telematic data for inclusion in the reduced telematic data, based on differences of the data points to iteratively-defined reference lines defined through portions of the input telematic data may comprise: selecting data points from the input telematic data for inclusion in the reduced telematic data, based on differences in acceleration between accelerations represented by the data points to iteratively-defined reference lines defined through portions of the acceleration data.

The method may further comprise receiving an indication of the threshold time period.

According to another broad aspect, the present disclosure describes a system for synchronizing data, the system comprising: at least one processor; at least one non-transitory processor-readable storage medium communicatively coupled to the at least one processor and storing processor-executable instructions which when executed by the at least one processor cause the system to: access, by the at least one processor, input video data of a first data rate and input telematic data of at least a second data rate different from the first data rate; receiving, by the at least one processor, an indication of a synchronized data rate; generate, by the at least one processor, reduced telematic data, by selecting data points from the input telematic data for inclusion in the reduced telematic data, based on differences of the data points to iteratively-defined reference lines defined through portions of the input telematic data; generate, by the at least one processor, interpolated video data by interpolating the input video data at the synchronized data rate for a threshold time period around each identified data point in the input telematic data; generate, by the at least one processor, interpolated telematic data by interpolating the reduced telematic data at the synchronized data rate for the threshold time period around each identified data point in the input telematic data; sample, by the at least one processor, the interpolated telematic data and the interpolated video data at the sample rate in the threshold time period; and store, by the at least one processor, the sampled video data and sampled telematic data as synchronized video and telematic data.

The processor-executable instructions which cause the at least one processor to select data points from the input telematic data for inclusion in the reduced telematic data, based on differences of the data points to iteratively-defined reference lines defined through portions of the input telematic data, may cause the at least one processor to, for each data point of the input telematic data: determine a minimum difference between the data point and a corresponding reference line of the iteratively-defined reference lines, where the data point is included in the reduced telematic data if the minimum difference between the data point and the corresponding reference line exceeds a difference threshold.

The processor-executable instructions which cause the at least one processor to select data points from the input telematic data for inclusion in the reduced telematic data, based on differences of the data points to iteratively-defined reference lines defined through portions of the input telematic data, may cause the at least one processor to: define a reference line through the input telematic data; identify a data point of the input telematic data, where a minimum difference between the data point and the reference line is greater than a minimum difference between other data points and the reference line; and if the minimum difference between the data point and the reference line exceeds a difference threshold: select the data point for inclusion in the reduced telematic data; and define new reference lines which intersect the sample point through the input telematic data. The processor-executable instructions which cause the at least one processor to select data points from the input telematic data for inclusion in the reduced telematic data, based on differences of the data points to iteratively-defined reference lines defined through portions of the input telematic data, may further cause the at least one processor to: define an additional reference line through the input telematic data which intersects a data point previously selected for inclusion in the reduced telematic data; identify an additional data point of the input telematic data, where a minimum difference between the additional data point and the additional reference line is greater than a minimum difference between other data points and the additional reference line; and if the minimum difference between the additional data point and the additional reference line exceeds the difference threshold: select the additional data point for inclusion in the reduced telematic data.

The input telematic data may include location data for a vehicle, and the processor-executable instructions which cause the at least one processor to select data points from the input telematic data for inclusion in the reduced telematic data, based on differences of the data points to iteratively-defined reference lines defined through portions of the input telematic data, may cause the at least one processor to: select data points from the input telematic data for inclusion in the reduced telematic data, based on physical distances between positions represented by the data points to iteratively-defined reference lines defined through portions of the location data.

The input telematic data may include speed data for a vehicle, and the processor-executable instructions which cause the at least one processor to select data points from the input telematic data for inclusion in the reduced telematic data, based on differences of the data points to iteratively-defined reference lines defined through portions of the input telematic data, may cause the at least one processor to: select data points from the input telematic data for inclusion in the reduced telematic data, based on differences in speed between speeds represented by the data points to iteratively-defined reference lines defined through portions of the speed data.

The input telematic data may include acceleration data for a vehicle, and the processor-executable instructions which cause the at least one processor to select data points from the input telematic data for inclusion in the reduced telematic data, based on differences of the data points to iteratively-defined reference lines defined through portions of the input telematic data, cause the at least one processor to: select data points from the input telematic data for inclusion in the reduced telematic data, based on differences in acceleration between accelerations represented by the data points to iteratively-defined reference lines defined through portions of the acceleration data.

The system may further comprise a user input device for receiving an indication of the threshold time period.

BRIEF DESCRIPTION OF THE DRAWINGS

Exemplary non-limiting embodiments are described with reference to the accompanying drawings in which.

DETAILED DESCRIPTION

Figure 1:
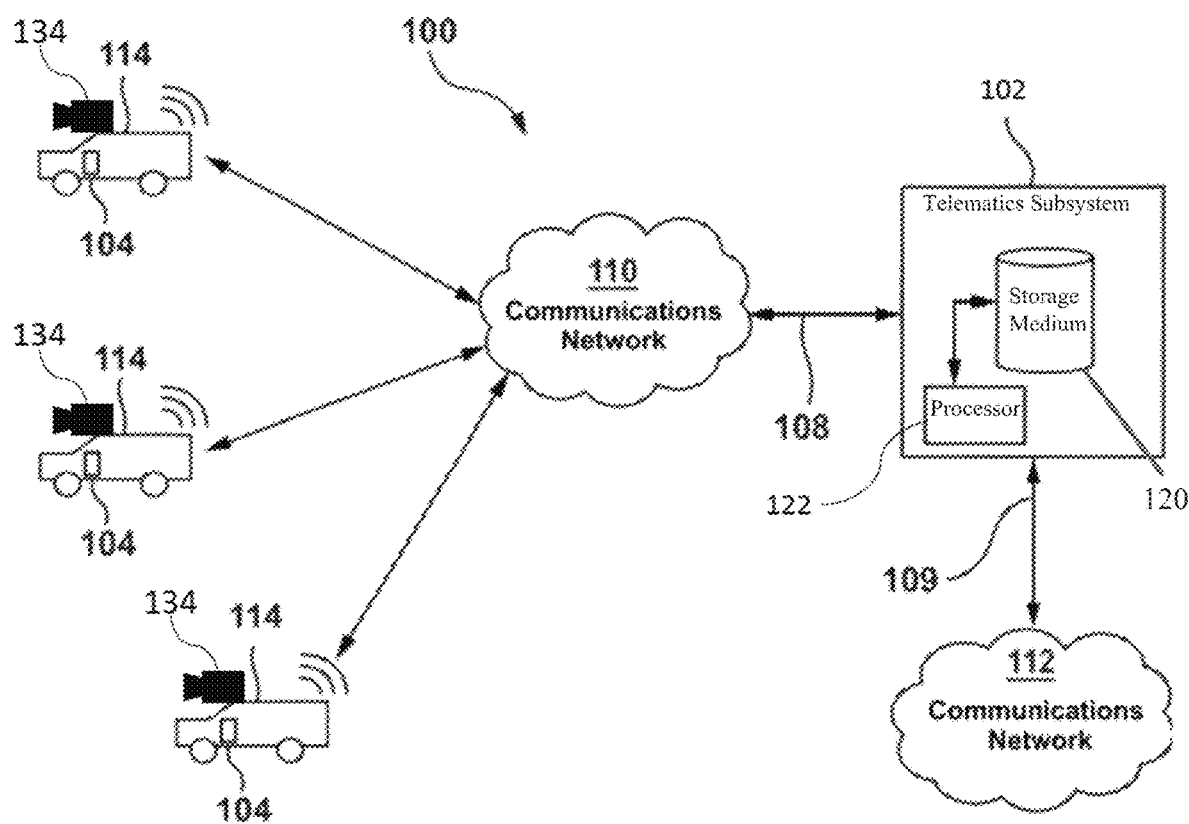
FIG. 1 is a schematic view of a telematics system.

The present disclosure details systems, methods, and devices for synchronizing data from multiple sensors. The present disclosure sees particular value in telematics, where telematic data regarding operation of a vehicle or plurality of vehicles is collected.

Telematics systems have been employed by fleet owners to monitor use and performance of vehicles in the fleet. A telematics system monitors a vehicle using an onboard telematic monitoring device for gathering and transmitting vehicle operation information. For instance, fleet managers can employ telematics to have remote access to real time operation information of each vehicle in a fleet. A vehicle may include a car, truck, recreational vehicle, heavy equipment, tractor, snowmobile or other transportation asset. A telematic monitoring device may detect environmental operating conditions associated with a vehicle, for example, outside temperature, attachment status of an attached trailer, and temperature inside an attached refrigeration trailer. A telematic monitoring device may also detect operating conditions of an associated vehicle, such as position, (e.g., geographic coordinates), speed, and acceleration, time of day of operation, distance traveled, stop duration, customer location, idling duration, driving duration, among others. Hence, the telematic monitoring device collects and transmits data to the telematics system that is representative of the vehicle operation and usage execution. This data may be collected over a time period of sufficient duration to allow for pattern recognition of the vehicle's operation. In an example the duration may be determined to be a number of days between 30 days and 90 days, though in practice any appropriate number of days could be implemented as the duration.

In an exemplary telematics system, raw vehicle data, including vehicle operation information indicative of a vehicle's operating conditions, is transmitted from an onboard telematic monitoring device to a remote subsystem, (e.g., data management system which may comprise a cloud system or a management system). Raw vehicle data may include information indicating the identity of the onboard telematic monitoring device (e.g., device identifier, device ID) and/or the identity of the associated vehicle the onboard telematic monitoring device is aboard. Specific and non-limiting examples of raw vehicle data includes device ID data, position data, speed data, ignition state data, (e.g. indicates whether vehicle ignition is ON or OFF), and datetime data indicative of a date and time vehicle operating conditions were logged by the telematic monitoring device. Raw vehicle data transmitted and collected over a period of time forms historical vehicle data which may be stored by the remote subsystem for future analysis of a single vehicle or fleet performance. In practice, a single fleet may comprise many vehicles, and thus large volumes of raw vehicle data (e.g., terabytes, petabytes, exabytes . . . ) may be transmitted to, and stored by, a remote subsystem. Throughout this application, vehicle data collected, processed, and/or transmitted by a telematics monitoring device can be broadly included in "telematic data", among other types of data such as location data discussed later.

In other exemplary telematics systems, a telematic monitoring device can have at least one processing unit thereon which processes or filters raw vehicle data, and transmits processed or filtered data. Such systems can reduce the bandwidth required for transmission and required storage capacity for transmitted data.

The use of telematics systems has resulted in improved performance and maintenance of vehicles in the fleet. Additionally, data from telematics systems can also be useful to analyze traffic, to provide information for infrastructure design, planning, and implementation.

Illustrated in FIG. 1 is a simplified block diagram of an exemplary telematics system for gathering and storing vehicle operation information. Telematics system 100 comprises telematics subsystem 102 having a first network interface 108 and onboard telematic monitoring devices 104 of vehicles 114 communicatively coupled therewith via communication network 110.

The telematics subsystem 102 in an implementation comprises a management system which is a managed cloud data warehouse for performing analytics on data stored therein. In another implementation, the management system may comprise a plurality of management systems, datastores, and other devices, configured in a centralized, distributed or other arrangement. In some implementations, one or more different management systems may be employed and configured separately or in a centralized, distributed or other arrangement. In the illustrated example, telematics subsystems 102 includes at least one non-transitory processor-readable storage medium 120 and at least one processor 122. The at least one non-transitory processor-readable storage medium 120 can store data on which analytics is performed, and/or can store instructions thereon. Said instructions, when executed by the at least one processor 122, cause the telematics subsystem to perform the desired operations, analysis, or data collection/aggregation.

Communication network 110 may include one or more computing systems and may be any suitable combination of networks or portions thereof to facilitate communication between network components. Some examples of networks include, Wide Area Networks (WANs), Local Area Networks (LANs), Wireless Wide Area Networks (WWANs), data networks, cellular networks, voice networks, among other networks, which may be wired and/or wireless. Communication network 110 may operate according to one or more communication protocols, such as, General Packet Radio Service (GPRS), Universal Mobile Telecommunications Service (UMTS), GSM, Enhanced Data Rates for GSM Evolution (EDGE), LTE, CDMA, LPWAN, Wi-Fi™, Bluetooth™, Ethernet, HTTP/S, TCP, and CoAP/DTLS, or other suitable protocol. Communication network 110 may take other forms as well.

Telematics system 100 may comprise another network interface 109 for communicatively coupling to another communication network 112. In an implementation, communication network 112 may comprise a communication gateway between the fleet owners and the telematics system 100.

Also shown in FIG. 1 are vehicles 114, each thereof having aboard the onboard telematic monitoring devices 104. A vehicle may include a car, truck, recreational vehicle, heavy equipment, tractor, snowmobile, or other transportation asset. Onboard telematic monitoring devices 104 may transmit raw vehicle data associated with vehicles 114 through the communication network 110 to the telematics subsystem 102.

Three telematic monitoring devices 104 are described in this example for explanation purposes only and embodiments are not intended to be limited to the examples described herein. In practice, a telematics system may comprise many vehicles 114, such as hundreds, thousands and tens of thousands or more. Thus, huge volumes of raw vehicle data may be received and stored by remote telematics subsystem 102.

In general, telematic monitoring devices 104 comprise sensing modules configured for sensing and/or measuring a physical property that may indicate an operating condition of a vehicle. For example, sensing modules may sense and/or measure a vehicle's position, (e.g., GPS coordinates), speed, direction, rates of acceleration or deceleration, for instance, along the x-axis, y-axis, and/or z-axis, altitude, orientation, movement in the x, y, and/or z direction, ignition state, transmission and engine performance, and times of operation among others. One of ordinary skill in the art will appreciate that these are but a few types of vehicle operating conditions that may be detected.

Telematic monitoring device 104 may comprise a sensing module for determining vehicle position. For instance, the sensing module may utilize Global Positioning System (GPS) technology (e.g., GPS receiver) for determining the geographic position (Lat/Long coordinates) of vehicle 114. Alternatively, the sensing module utilizes another a global navigation satellite system (GNSS) technology, such as, GLONASS or BeiDou. Alternatively, the sensing module may further utilize another kind of technology for determining geographic position. In addition, the sensing module may provide other vehicle operating information, such as speed. Alternatively, the telematic monitoring device 104 may communicate with a plurality of sensing modules for a vehicle.

Alternatively, vehicle position information may be provided according to another geographic coordinate system, such as, Universal Transverse Mercator, Military Grid Reference System, or United States National Grid.

In general, a vehicle 114 may include various control, monitoring and/or sensor modules for detecting vehicle operating conditions. Some specific and non-limiting examples include, an engine control unit (ECU), a suspension and stability control module, a headlamp control module, a windscreen wiper control module, an anti-lock braking system module, a transmission control module, and a braking module. A vehicle may have any combination of control, monitoring and/or sensor modules. A vehicle may include a data/communication bus accessible for monitoring vehicle operating information, provided by one or more vehicle control, monitoring and/or sensor modules. A vehicle data/communication bus may operate according to an established data bus protocol, such as the Controller Area Network bus (CAN-bus) protocol that is widely used in the automotive industry for implementing a distributed communications network. Specific and non-limiting examples of vehicle operation information provided by vehicle monitoring and/or sensor modules include, ignition state, fuel tank level, intake air temp, and engine RPM among others.

Telematic monitoring device 104 may comprise a monitoring module operable to communicate with a data/communication bus of vehicle 114. The monitoring module may communicate via a direct connection, such as, electrically coupling, with a data/communication bus of vehicle 114 via a vehicle communication port, (e.g., diagnostic port/communication bus, OBDII port). Alternatively, the monitoring module may comprise a wireless communication interface for communicating with a wireless interface of the data/communication bus of vehicle 114. Optionally, a monitoring module may communicate with other external devices/systems that detect operating conditions of the vehicle.

Telematic monitoring device 104 may be configured to wirelessly communicate with telematics subsystem 102 via a wireless communication module. In some embodiments, telematic monitoring device 104 may directly communicate with one or more networks outside vehicle 114 to transmit data (such as telematic data) to telematics subsystem 102. A person of ordinary skill will recognize that functionality of some modules may be implemented in one or more devices and/or that functionality of some modules may be integrated into the same device.

Telematic monitoring devices 104 may transmit raw vehicle data (or telematic data), indicative of vehicle operation information collected thereby, to telematics subsystem 102. The raw vehicle data may be transmitted at predetermined time intervals, (e.g. heartbeat), intermittently, and/or according to other predefined conditions. Raw vehicle data (or telematic data) transmitted from telematic monitoring devices 104 may include information indicative of device ID, position, speed, ignition state, and date and time operating conditions are logged, for instance, in an onboard datastore. One of ordinary skill in the art will appreciate that raw vehicle data may comprise data indicative of numerous other vehicle operating conditions. Raw vehicle data may be transmitted from a monitoring device when a vehicle is moving, stationary, and during both ON and OFF ignition states.

Also shown in FIG. 1 are image sensors 134, each aboard a respective vehicle 104. Each of image sensor 134 could for example be a camera, such as a video camera. Such image sensors capture image data (or video data, as a sequence of images) in a field of view of the respective image sensor. In some cases, an image sensor is positioned and oriented to capture image data representing a field of view outside the vehicle (e.g. a dash cam, rear view cam, or other camera pointed externally to the vehicle). In some cases, an image sensor is positioned and oriented to capture image data representing a field of view inside the vehicle (e.g. a driver-facing camera, a camera aimed at an instrument panel, or other camera pointed internally in the vehicle). Similar to telematic data, image data captured by image sensors 134 can be transmitted to telematics subsystem 102 by communications network 110. In some implementations, an image sensor 134 can transmit captured image data to telematics subsystem 102 by communication hardware of the image sensor 134. In other implementations, transmission of image data from an image sensor 134 can be performed via a telematics monitoring device 104 (aboard the same vehicle), such that the image sensor does not require transmission capabilities for communication via communications network 110. Transmission of image data can be raw, or the image data can be pre-processed, compressed, filtered, or any other appropriate operation to reduce required bandwidth for transmission.

Data collected by telematics monitoring device 104 and image sensors 134 can have different data rates, for example due to differences in frequency data is captured and/or an extent of filtering of captured data. This is true for different types of telematic data (e.g. position data, speed data, acceleration data, or other telematic data), and for video data. When performing analysis on the telematic and/or video data, this lack of synchronization of data can be problematic. For example, in collision reconstruction (determining what happened during a collision based on available data), low frequency data and/or unsynchronized data make reconstruction difficult, and introduce a lack of confidence or trust in the quality of the data. As another example, when data from multiple sources is used to train a machine learning model, where detection by the machine learning model will be based on all of the available data from the multiple data sources, lack of synchronization of the data can result in a model which is not accurately trained.

Figure 2:
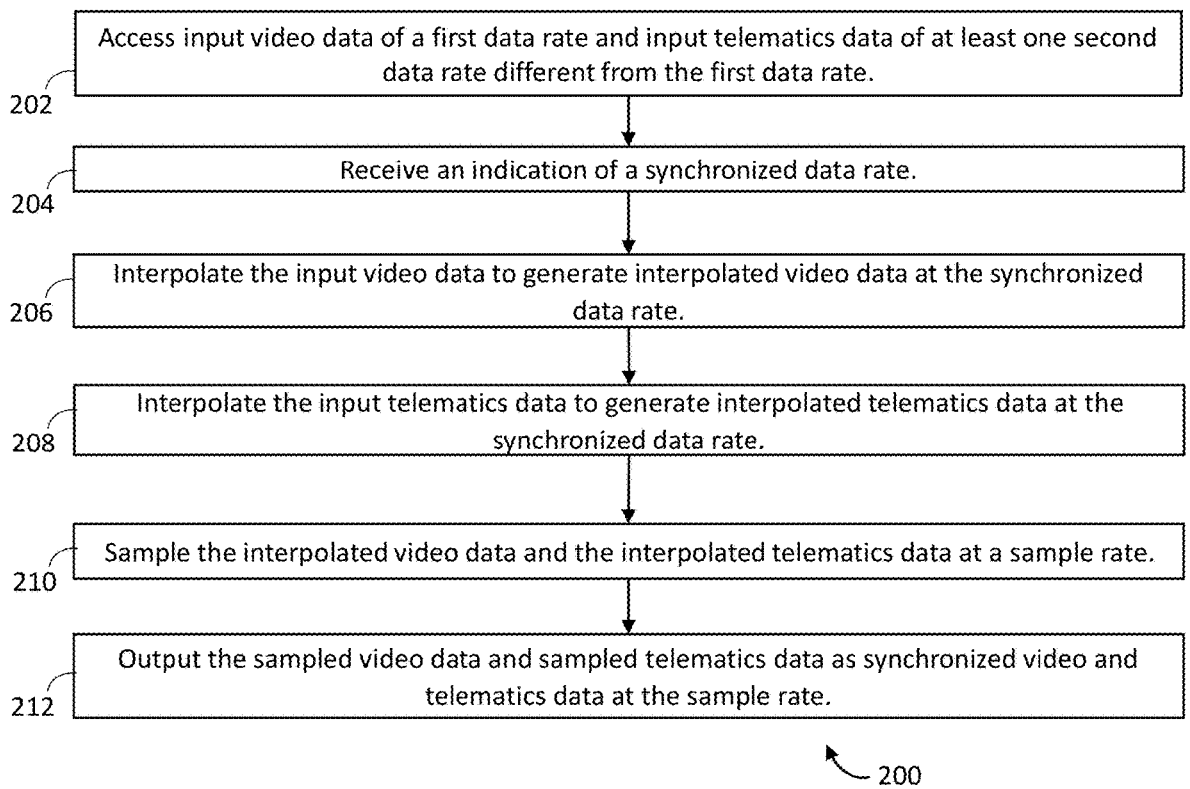
FIG. 2 is a flowchart diagram of a method for synchronizing data.

FIG. 2 is a flowchart diagram which illustrates an exemplary method 200 for synchronizing video data and telematic data. Method 200 as illustrated includes acts 202, 204, 206, 208, 210, and 212. One skilled in the art will appreciate that additional acts could be added, acts could be removed, or acts could be reordered as appropriate for a given application. With reference to the example illustrated in FIG. 1, acts can be performed by appropriate components of a system such as system 100 in FIG. 1. For example, acts of interpolation and sampling can be performed by at least one appropriate processor such as processor 122 of telematics subsystem 102, or by at least one processor at a vehicle 114 (such as a processor of a telematics monitoring device 104). Reference to "at least one processor" or "a processor" performing acts of method 200 can refer to any appropriate processor. Further, at least one non-transitory processor-readable storage medium, such as non-transitory processor-readable storage medium 120 of management device 102, or a non-transitory processor-readable storage medium at a vehicle 114 (such as a processor of a telematics monitoring device 104), could have processor-executable instructions stored thereon, which when executed by a respective at least one processor (e.g. processor 122 or a processor at a vehicle 114) cause the system (e.g. telematics subsystem 102 or telematics device 104) to perform a given act of method 200.

At 202, input video data of a first data rate is accessed by the processor which will perform the interpolation and sampling. Also at 202, input telematic data of at least one second data rate different from the first data rate is accessed by the processor which will perform the interpolation and sampling. Throughout this disclosure, "data rate" refers to the frequency or regularity in time of points of data. For example, a data rate of video data can be expressed in "frames per second" or "FPS". As another example, data rates can be expressed in hertz (Hz), or the inverse of a period between data points. In some cases, a data rate for a given set of data may not be regular. For example, position data may be collected at times when a position of a position sensor can be accurately measured, but not collected at other times when position of the position sensor cannot be measured (or cannot be accurately measured). As another example, data may be selectively filtered to eliminate or ignore redundant data to reduce storage or bandwidth needs to store and/or transmit said data. A specific example of such selectively filtering, called "curve logging" is discussed in more detail later. As yet another example, data may be selectively filtered to eliminate outlying data points or points deemed erroneous. As yet another example, some data may be collected and transmitted to telematic subsystem 106 in response to changes in said data (e.g., ignition state data may only be collected and transmitted when the ignition state changes).

In the context of act 202, the input telematic data is described as having "at least one second data rate". This is because the telematic data can include multiple types of data, or multiple data sets representing data from different sensors, captured at different data rates. Each of these different data sets can be synchronized in the process of method 200. This discussion also applies to any other pre-synchronization telematic data.

Data being "accessed" in act 202 can have different meaning depending on where the data is stored and where the data is processed. In one example, the input video data and the input telematic data are stored on non-transitory processor-readable storage medium 120 (e.g. after having been received by telematics subsystem 106 from telematics device 104). In this example, "accessing" the input video data and the input telematic data refers to the at least one processor 122 retrieving the input video data and the input telematic data from non-transitory processor-readable storage medium 120. In another example, the input video data and the input telematic data are stored on non-transitory processor-readable storage medium of a telematics monitoring device 104, and are to be processed by a processor of the same telematics monitoring device 104. In this example, "accessing" the input video data and the input telematic data refers to the at least one processor of the telematics monitoring device 104 retrieving the input video data and the input telematic data from the non-transitory processor-readable storage medium of the telematics monitoring device 104. In yet another example, the input video data and the input telematic data are stored on non-transitory processor-readable storage medium of a telematics monitoring device 104, and are to be processed by processor 122 of telematics subsystem 106. In this example, "accessing" the input video data and the input telematic data refers to the telematics monitoring device 104 transmitting the input video data and the input telematic data to the telematics subsystem 106, and the processor 122 receiving the input video data and the input telematic data.

Throughout this disclosure, the terms "input video data" and "input telematic data" refer to initial video data or initial telematic data, based on which the present systems, devices, and methods perform interpolation, sampling, synchronizing, and any other appropriate acts. The term "input" is thus a label used to distinguish types or stages of data (e.g. input data at the outset of a method, as opposed to interpolated data or synchronized data generated during the method). The term "input" in this context is NOT intended to limit the video data or the telematic data to be provided as user input, for example.

At 204, an indication of a synchronized data rate is received by the processor which will perform the interpolation and sampling. The "synchronized data rate" refers to a data rate which is higher than the first data rate and the second data rate, where there are sufficient data points in the video data and the telematic data which temporally align at a desired sample rate (discussed later). In some implementations, the synchronized data rate is received as user input. That is, a device in system 100 is provided with a user input interface (e.g. a keyboard, mouse, display, or other appropriate device), by which a user (operator) inputs a synchronized data rate. In other implementations, the synchronized data rate is derived by the at least one processor, based on a sample data rate which is received as user input. That is, the user inputs a desired sample rate for the data, and the processor determines a synchronized data rate where sufficient points of video data and telematic data temporally align to achieve the input sample rate. In other implementations, the synchronized data rate (and the sample rate) may be pre-defined, to provide a consistent rate of synchronized/sampled data. In yet other implementations, the synchronized data rate is derived by the at least one processor. In particular, the first data rate and the second data rate can be multiplied together to determine a derived synchronized data rate where both the video and telematic data, when interpolated to the synchronized data rate, have a consistent quantity of temporally aligning points. In some implementations, the synchronized data rate can be determined as the highest data rate among data rates for the data sets which are to be synchronized.

The user input device discussed above can also be used by a user (operator) to input other information, such as a threshold time period as discussed later with reference to FIGS. 4, 5F, 5G, 6F, 6G, and 6H.

At 206, the input video data is interpolated by the at least one processor, to generate interpolated video data at the synchronized data rate. That is, additional video data is generated between points of captured video data, to increase the data rate of the video data to the synchronized data rate. Known interpolation techniques can be used in this regard, such as motion prediction algorithms which track detected features in video data, or machine-learning based techniques such as with GANs (Generative Adversarial Networks).

Non-limiting algorithms include Softmax Splatting, ABME (Asymmetric Bilateral Motion Estimation), and FILM (Frame Interpolation for Large Motion).

At 208, the input telematic data is interpolated by the at least one processor, to generate interpolated telematic data at the synchronized data rate. That is, additional telematic data is generated between points of captured telematic data, to increase the data rate of the telematic data to the synchronized data rate. Known interpolation techniques can be used in this regard, such as curve fitting techniques, averaging filters, or other appropriate algorithms. Any appropriate curve fitting techniques could be used, such as polynomial curve fitting. Order of polynomial fit used can be selected as appropriate for a given application.

In any of the interpolation operations discussed herein, interpolated data can also be time-compensated (phase-shifted) to align data points at the synchronized data rate. For example, even if two data sets are interpolated to the synchronized data rate, the resulting interpolated data sets may be time-misaligned by a fixed amount. To address this, interpolation of the data sets can account for time-shifts, to generate the interpolated data in alignment with other interpolated data.

At 210, the video data and the telematic data are sampled at a sample rate. That is, samples of the interpolated video data and the interpolated telematic data are collected at intervals according to the sample rate. As discussed earlier, in some implementations the sample rate can be provided as user input. In other implementations, the sample rate can be pre-defined as an adequate data rate which provides sufficient data resolution appropriate to an application at hand.

At 212, the sampled video data and the sampled telematic data, as sampled at 210, are output as synchronized video and telematic data at the sample rate.

Figure 3:
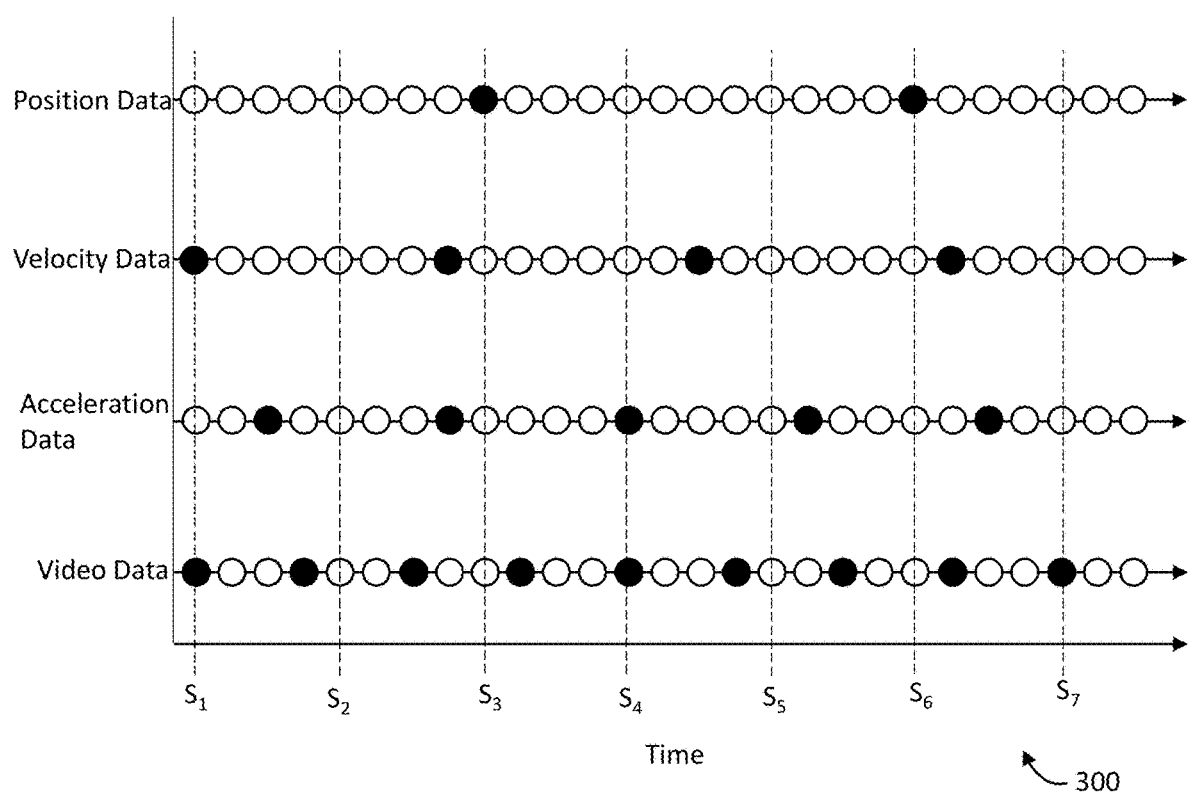
FIG. 3 is plot which illustrates an exemplary data synchronization scenario.

FIG. 3 shows a plot 300 illustrating an exemplary scenario where method 200 is used. In the example of FIG. 3, the input telematic data accessed in act 202 of method 200 includes position data, velocity data, and acceleration data. One skilled in the art will appreciate that additional types of data, or fewer types of data, could be included in the input telematic data. FIG. 3 also illustrates the video data as accessed in act 202 of method 200.

In FIG. 3, each type of data accessed is plotted on a respective horizontal line, with respect to time. Each black circle represents a point of real-world captured data, whereas each white circle represents a point of interpolated data (as interpolated with respect to acts 206 and 208 of method 200). FIG. 3 illustrates a sample size of data, including 27 total captured and interpolated data points for each data type. One skilled in the art will appreciate that many more data points can be captured or interpolated in practice. Further, one skilled in the art will appreciate that additional data points can be captured or interpolated which precede illustrated data points in time, or which succeed the illustrated data points in time. For ease of discussion, each circle shown in plot 300 represents one second of time, such that the total amount of time shown in plot 300 is 27 seconds. One skilled in the art will appreciate that this amount of time (and the corresponding data rates) are merely exemplary, and data for any appropriate amount of time (at any appropriate data rate) can be accessed.

In the example of FIG. 3, the first data rate in method 200 corresponds to the data rate of the captured points of video data. In this case, the first data rate is ⅓ frames per second, or one point of video data (one frame or one image) is captured every three seconds. Further, the at least one second data rate of the telematic data includes a respective position data rate (corresponding to the data rate of the captured points of position data, shown as 1 point of position data per 12 seconds), velocity data rate (corresponding to the data rate of the captured points of velocity data, shown as 1 point of velocity data per 7 seconds), and acceleration data rate (corresponding to the data rate of the captured points of acceleration data, shown as one point of acceleration data per 5 seconds).

In accordance with act 204 of method 200, an indication of a synchronized data rate is received. As mentioned above, in some implementations, the indication of synchronized data rate may be received as user input. In other implementations, the indication of synchronized data rate may be derived by the at least one processor from a sample rate which is received as input. In plot 300, samples S1, S2, S3, S4, S5, S6, and S7 are illustrated, at a sample rate of one sample per four seconds. A synchronized data rate of 1 sample per second can be derived as a sufficient rate such that each data set will have reliable interpolated data points every four seconds. In yet other implementations, the synchronized data rate is determined by the at least one processor, based on the respective data rates of the accessed data. In the example of FIG. 3, a common data rate is determined for the data rates for each of the data sets. As discussed below, the data rate for the position data is one point per 12 second (0.08333 . . . Hz); the data rate for velocity data is one point per seven seconds (0.142857 . . . Hz); the data rate for acceleration data is one point per five seconds (0.2 Hz); and the data rate for video data is on point per three seconds (0.333 Hz). The data rates in FIG. 3 are merely exemplary, and in practice these data sets could have any appropriate data rate. A common data rate which would align with each of these individual data rates is one point per second, and so the synchronized data rate is determined as one point per one second. In alternative implementations, the synchronized data rate can be provided by a user or operator.

In accordance with act 206 of method 200, the video data is interpolated by the at least one processor to generate interpolated video data at the synchronized data rate. In the example of FIG. 3, the video data is interpolated to generated two interpolated video frames (two images) between each pair of captured video frames (captured images). That is, the video data is interpolated from 1 frame per three seconds to 1 frame per second. This interpolation can be performed using any appropriate known method, such as those listed earlier.

In accordance with act 208 of method 200, the input telematic data is interpolated by the at least one processor to generate interpolated telematic data at the synchronized data rate. In the example of FIG. 3, the position data is interpolated to generated eleven interpolated position data points between each pair of captured position data points. That is, the position data is interpolated from 1 point per 12 seconds to 1 point per second. Further the example of FIG. 3, the velocity data is interpolated to generated six interpolated velocity data points between each pair of captured velocity data points. That is, the velocity data is interpolated from 1 point per seven seconds to 1 point per second. Further still in the example of FIG. 3, the acceleration data is interpolated to generated four interpolated acceleration data points between each pair of captured acceleration data points. That is, the acceleration data is interpolated from 1 point per five seconds to 1 point per second. These interpolations can be performed using any appropriate known method, such as those discussed earlier.

In accordance with act 210 of method 200, the interpolated video data and the interpolated telematic data are sampled by the at least one processor at a sample rate. That is, corresponding data points (temporally aligned data points) are retrieved from each data set, at sample intervals corresponding to the sample rate. In the example of FIG. 3, a data point (whether captured or generated by interpolation) is sampled from each data set, at times illustrated as samples S1, S2, S3, S4, S5, S6, and S7.

In accordance with act 212 of method 200, the sampled video data and the sampled telematic data are output as synchronized video and telematic data at the sample rate. In the example of FIG. 3, the samples S1, S2, S3, S4, S5, S6, and S7 (including position, velocity, acceleration, and video data samples) are collected as synchronized data, and output to another module (e.g. transmitted to another device, stored on a non-transitory processor-readable storage medium, or presented to a user for review). In some implementations, the output data is stored for historical purposes (e.g. archiving, in the event that review might be desired in the future). In other implementations, the output data is stored for the purpose of specific review (e.g. reconstruction of a collision). In yet other implementations, the output data is stored for use in training a machine learning algorithm (the data is synchronized as part of a process of creating training data).

Figure 4:
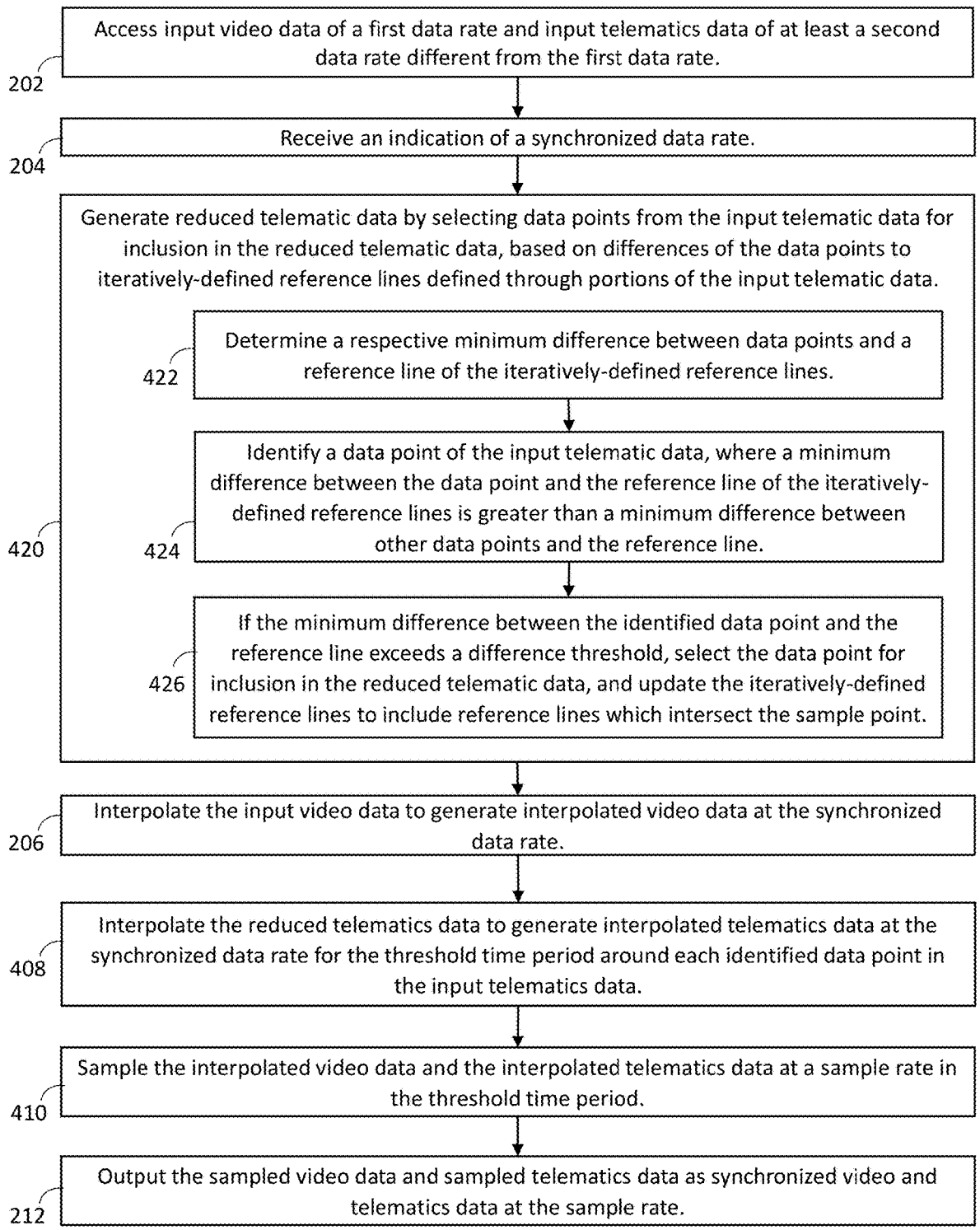
FIG. 4 is a flowchart diagram of another method for synchronizing data.

FIG. 4 is a flowchart diagram which illustrates an exemplary method 400 for synchronizing video data and telematic data. Method 400 is similar in at least some respects to method 200 discussed with reference to FIG. 2. Method 400 as illustrated includes acts 202, 204, 410 (which is illustrated as including exemplary sub-acts 412, 414, and 416), 206, 408, 210, and 212. Where acts are labelled with a reference numeral corresponding to an act discussed with reference to method 200 in FIG. 2, the description of the act with reference to method 200 is fully applicable to the corresponding act in method 400 in FIG. 4. One skilled in the art will appreciate that additional acts could be added, acts could be removed, or acts could be reordered as appropriate for a given application. With reference to the example illustrated in FIG. 1, acts can be performed by appropriate components of a system such as system 100 in FIG. 1. For example, acts of interpolation and sampling can be performed by at least one appropriate processor such as processor 122 of telematics subsystem 102, or by at least one processor at a vehicle 114 (such as a processor of a telematics monitoring device 104). Reference to "at least one processor" or "a processor" performing acts of method 200 can refer to any appropriate processor. Further, at least one non-transitory processor-readable storage medium, such as non-transitory processor-readable storage medium 120 of management device 102, or a non-transitory processor-readable storage medium at a vehicle 114 (such as a processor of a telematics monitoring device 104), could have processor-executable instructions stored thereon, which when executed by a respective at least one processor (e.g. processor 122 or a processor at a vehicle 114) cause the system (e.g. telematics subsystem 102 or telematics device 104) to perform a given act of method 400.

At 202, input video data of a first data rate and input telematic data of a second data rate are received, similar to as discussed earlier regarding method 200.

At 204, an indication of a synchronized data rate is received, similar to as discussed earlier regarding method 200.

At 420, reduced telematic data is generated. This entails selecting data points from the input telematic data for inclusion in the reduced telematic data, based on difference of the data points to iteratively-defined reference lines defined through portions of the input telematic data. In a particular example, a minimum difference between a data point and a corresponding reference line of the iteratively-defined reference lines is determined, and the data point is included in the reduced telematic data if the minimum difference between the data point and the corresponding reference line exceeds a difference threshold. Further, act 420 (and sub-acts 422, 424, and 426) can be performed iteratively. That is, in sub-act 426 the iteratively-defined reference lines are updated (as discussed in detail later); based on the updated iteratively-defined references lines, act 420 can be performed again, to further narrow data points selected for inclusion in the reduced telematic data. This is discussed in detail in the examples of FIGS. 5A-5G and 6A-6H.

Act 420 as shown in the non-limiting example of FIG. 4 includes sub-acts 422, 424, and 426. At 422, a respective minimum difference is determined between data points and a reference line of the iteratively-defined reference lines. The set of data points for which a minimum difference is determined at 422 can in some cases include an entire set of telematic data (or a type of data within a set of telematic data include multiple data types). Alternatively, in some cases, the set of data points for which a minimum difference is determined at 412 can be limited to data points pertinent to a reference line to which the data points are being compared (e.g., only data points captured within a time frame to which the reference line corresponds may be analyzed at 422). This is discussed in more detail later.

At 424, a data point of the input telematic data is identified (e.g. by the at least one processor), where a minimum difference between the data point and the reference line of the iteratively-defined reference lines is greater than a minimum difference between other data points (of the analyzed set of data points) and the reference line. That is, the data point which is the most different from the reference line (of the analyzed set of data points) is identified.

At 426, if the minimum different between the data point identified in act 424 and the reference line exceeds a difference threshold, the identified data point is selected for inclusion in the reduced telematic data. That is, if the identified data point is sufficiently different from the reference line, the identified data point is included in the reduce telematic data. Generally, this means that the identified data point represents an inflection point in the input telematic data (i.e. is a point representing a pattern of substantial change in the input telematic data). Further at 426, if the minimum difference between the identified data point and the reference line exceeds the difference threshold, the iteratively-defined reference lines are updated to include reference lines which intersect the sample point. That is, the set of iteratively-defined reference lines are updated to pass through the identified data point.

If the minimum difference between the identified data point and the reference line does not exceed the difference threshold, the identified data point is not included in the reduced telematic data, nor or the other data points where the minimum difference to the reference line is less than for the identified data point. In this way, data points which do not represent an inflection or change in pattern of the telematic data are not included in the reduced telematic data.

Act 420 is repeated, until a reduced set of data points, and reference lines therebetween, are defined which approximately represent the input telematic data. Examples of act 420 and sub-acts 422, 424, and 426 are discussed in detail later with reference to FIGS. 5A-5D and 6A-6E.

At 206, the input video data is interpolated to generate interpolated video data, similar to as discussed with reference to method 200.

At 408, the reduced telematic data is interpolated to generate interpolated telematic data at the synchronized data rate for the threshold time period around each identified data point in the input telematic data. Act 408 in method 400 is similar to act 208 in method 200, and generally description of act 208 is applicable to act 408. One difference between act 408 and act 208 is that in act 408, interpolation is performed on the reduced telematic data, in a threshold time period around each identified data point. That is, generation of the interpolated telematic data in method 400 is targeted around identified points which represent an inflection or change in a pattern in the input telematic data. In this way, generation of the interpolated telematic data is focused on data points of particular interest, thereby reducing the computational burden to generate, store, and transmit the interpolated telematic data.

At 410, the interpolated video data and the interpolated telematic data are sampled at a sample rate, similar to as described regarding method 200. One difference between act 410 and act 210 is that in act 410, sampling is performed for the threshold time period around each identified data point. That is, sampling of the interpolated telematic data and interpolated video data in method 400 is targeted around the identified points around which the interpolated data was generated.

At 212, the sampled video data and the sampled telematic data are output as synchronized video and telematic data at the sample rate, similar to as in act 212 of method 200.

Figure 5A:
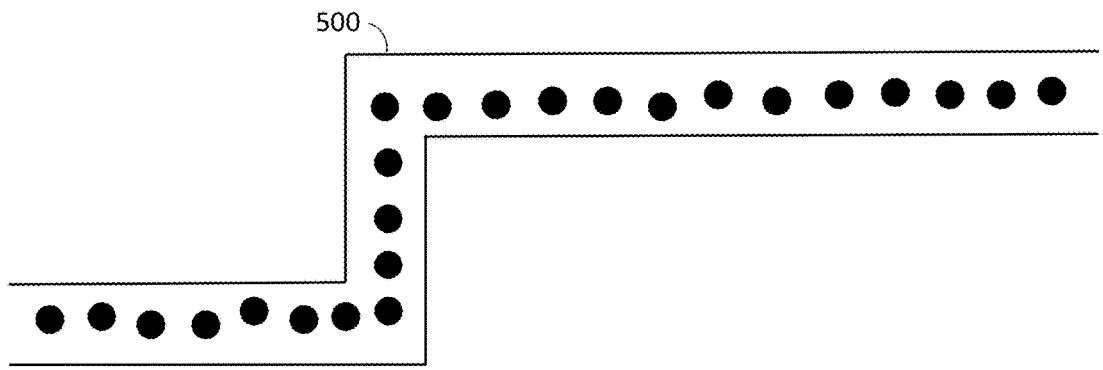
FIGS. 5A, 5B, 5C, and 5D are plots which illustrate an exemplary scenario where reduced telematic data is generated from input telematic data.
Figure 5B:
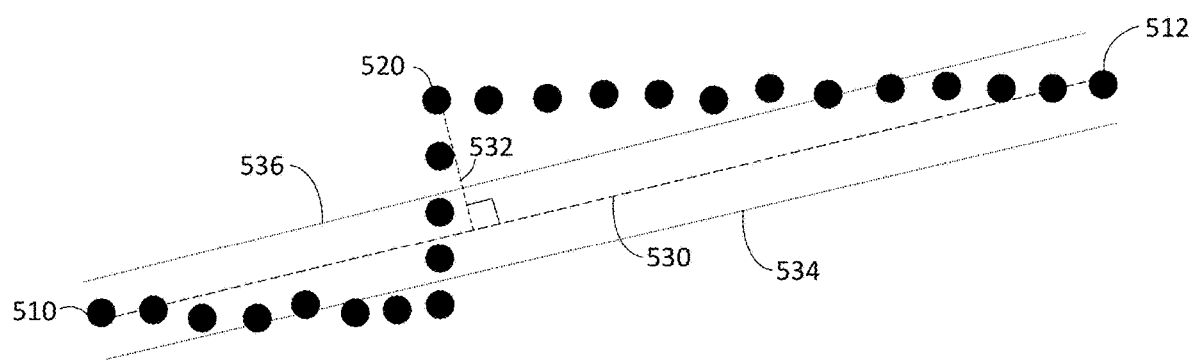
Figure 5C:
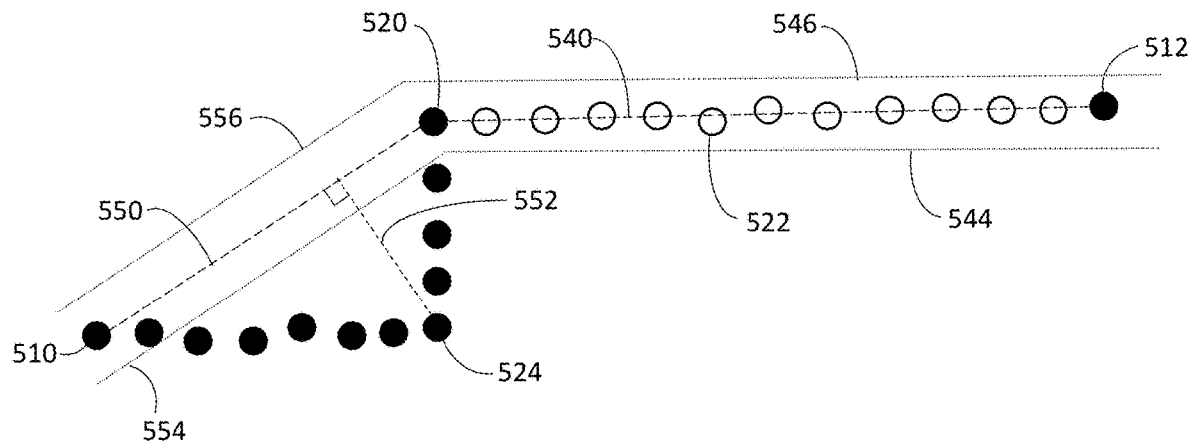
Figure 5D:
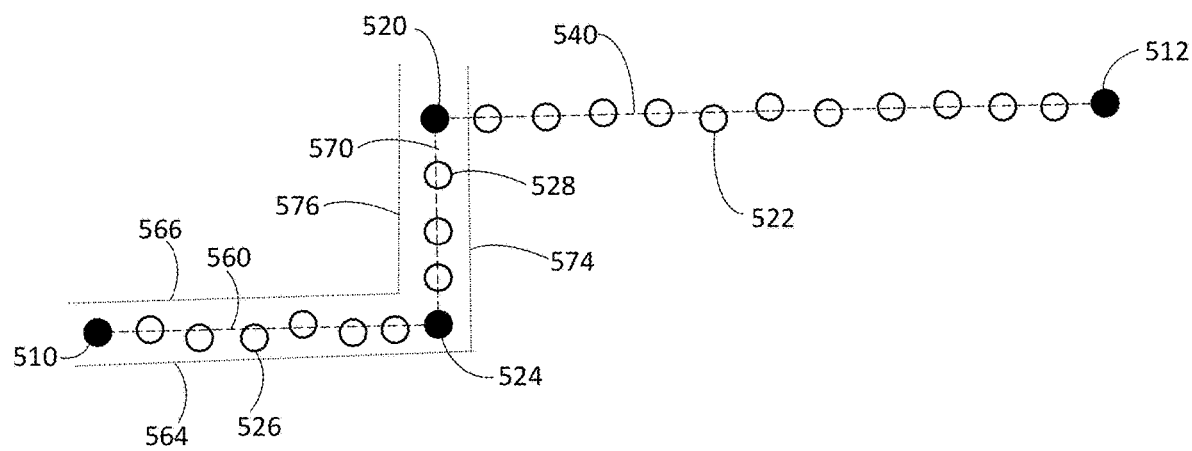
Figure 5E:
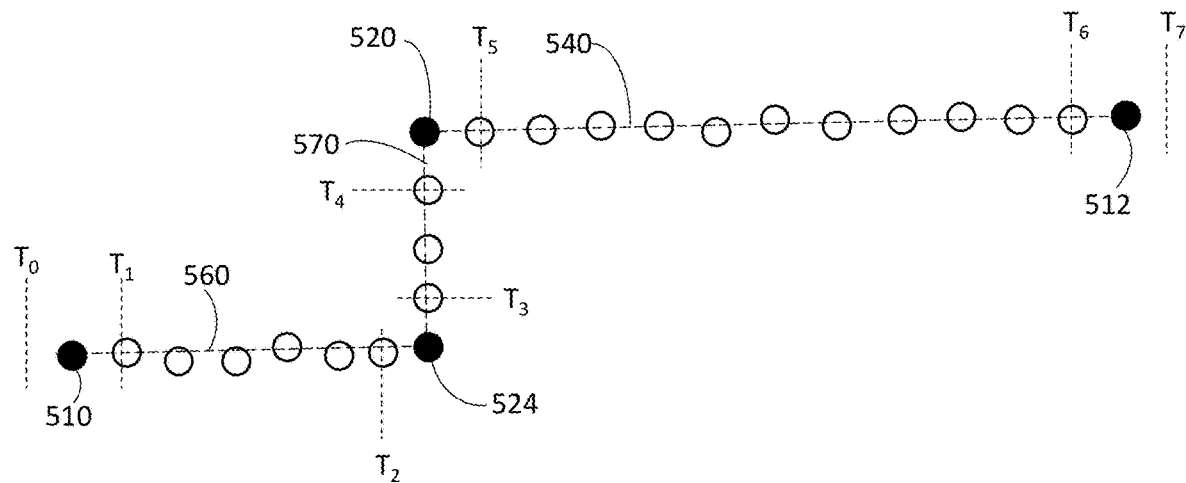
FIGS. 5E, 5F, and 5G are plots which illustrate an exemplary scenario where interpolated telematic data is generated in threshold time periods based on reduced telematic data.
Figure 5F:
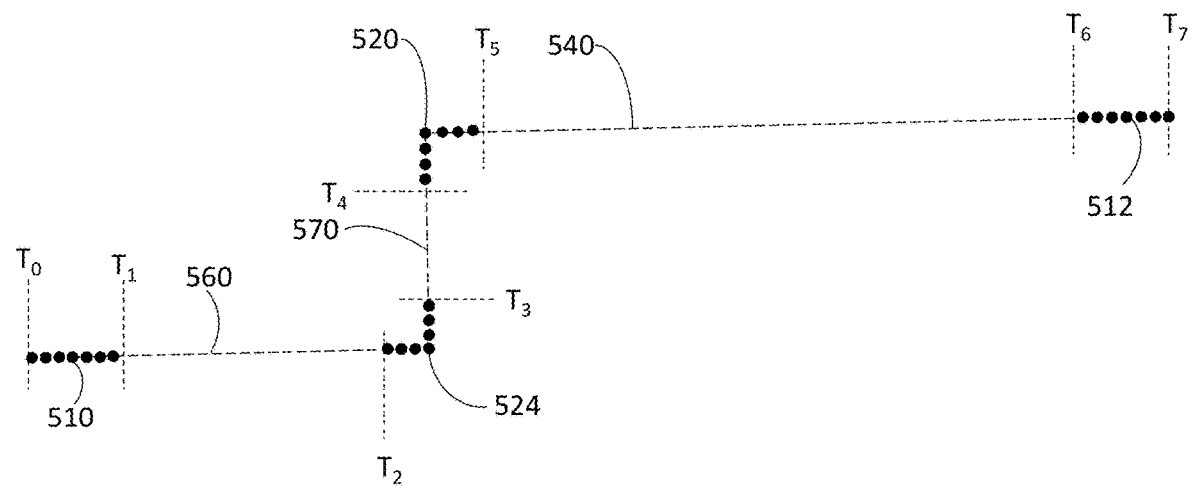
Figure 5G:
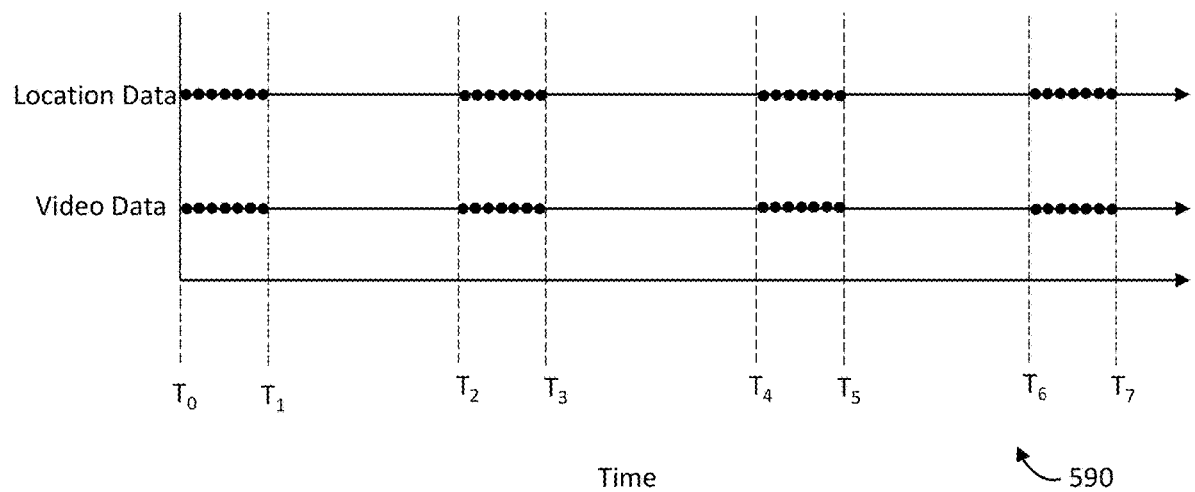

FIG. 5A is an exemplary plot which illustrates an exemplary set of input telematic data. FIGS. 5B, 5C, and 5D are plots which illustrate an exemplary process for generating reduced telematic data from the input telematic data shown in FIG. 5A (an example of act 410 and sub-acts 412, 414, and 416 in method 400 of FIG. 4), by iteratively-defining reference lines and comparing distances of data points to the iteratively-defined reference lines. FIGS. 5E and 5F are plots which illustrate an exemplary process for interpolating the reduced telematic data (an example of act 408 in method 400). FIG. 5G is a plot which illustrates interpolated telematic data and video data. In the case of FIGS. 5A-5G, the input telematic data includes at least location data (e.g. geographic position, GPS, or other location data).

FIG. 5A illustrates a roadway 500 along which a vehicle travels (such as any of vehicles 114 discussed with reference to FIG. 1). A telematic monitoring device (such as telematic monitoring device 104 discussed with reference to FIG. 1) captures location data indicating location of the vehicle as the vehicle travels along roadway 500. In the example of FIG. 5A each black circle represents a point of location data included by the telematic monitoring device in the input telematic data of method 400. What is meant by "included by the telematic monitoring device in the input telematic data" can have various meanings as appropriate for a given application. In some implementations, every point of location data captured by the telematic monitoring device can be included in the input telematic data. In other implementations, captured location data can be filtered to eliminate outlying or anomalous data points from the input telematic data. For example, data points which are too far from adjacent data points to be physically possible for the vehicle to travel can be filtered out, as these data points typically represent location sensor errors, communication errors, or other errors. As another example, data points which are dissimilar from a pattern of other data points (anomalous data points) can also be filtered out for similar reasons.

In the example of FIGS. 5A-5G, the telematic data being discussed includes location data, such that a "difference" between a given data point and a reference line represents physical distance between the data point and the reference line. In this way, selecting data points from the input telematic data for inclusion in the reduced telematic data, based on differences of the data points to iteratively-defined reference lines defined through portions of the input telematic data (as in act 420 of method 400) includes selecting data points from the input telematic data for inclusion in the reduced telematic data, based on physical distances between positions represented by the data points to iteratively-defined reference lines defined through portions of the location data.

Each point of location data in FIGS. 5A-5E is not expressly labelled, to reduce clutter. Generally, however, location data illustrated as a black circle indicates location data which is not (or has not yet been) excluded from the reduced telematic data in accordance with act 420 of method 400. Location data which has been excluded from the reduced telematic data is illustrated as white circles in FIGS. 5C-5E.

FIG. 5B illustrates the set of location data shown in FIG. 5A (the input telematic data in this example). In FIG. 5B, a reference line 530 is defined between end points 510 and 512 of the input telematic data. In the example of FIGS. 5A-5E, reference line 530 is a first reference line of a set of iteratively-defined reference lines as mentioned above regarding acts 420, 422, 424, and 426. End points 510 and 512 can be defined in various ways. In some implementations, end points 510 and 512 can be defined as the start and end, respectively, of a trip or journey by the vehicle (e.g. when the vehicle is activated or moved, until the vehicle is deactivated or stops moving). In some implementations, end points 510 and 512 can be defined as the start and end, respectively, of a region of data of interest. For example, a user can provide input indicating that the data from point 510 to point 512 is of interest, and the generation of reduced telematic data is performed over this region of interest. What is considered a region of "interest" is highly application and situation specific, and could for example refer to a region where reduction of telematic data is considered likely to be effective (e.g. journeys over long, straight roads).

In accordance with act 420 in method 400, reduced telematic data is generated by iteratively selecting data points from the input telematic data, based on differences of the data points to reference lines. In the scenario of FIG. 5B, a minimum difference between respective data points (data points sequentially between end points 510 and 512) and reference line 530 is determined, in accordance with act 422 of method 400.

Further, in accordance with act 424 of method 400, a data point of the input telematic data is identified, where a minimum difference between the data point and the reference line 530 is greater than a minimum difference between other data points being compared (sequential points between points 510 and 512) and the reference line 530. That is, a data point of the input telematic data between points 510 and 512 is identified which is the most different from the reference line 530. In FIG. 5B, this data point is labelled as point 520, with the minimum difference between point 520 and reference line 530 illustrated by line 532 (perpendicular to reference line 530).

Following identification of point 520, a determination is made as to whether the minimum difference between point 520 and reference line 530 exceeds a difference threshold, in accordance with act 426 of method 400. In FIG. 5B, a difference threshold is illustrated around reference line 530, shown as threshold lines 534 and 536. As can be seen in FIG. 5B, point 520 lies outside of threshold lines 534 and 536, and therefore the difference (distance of line 532) exceeds the difference threshold. Consequently, point 520 is selected for inclusion in the reduced telematic data as in act 426 of method 400.

Further in accordance with act 426 of method 400, the iteratively-defined reference lines are updated to include reference lines which intersect point 520, as is shown in FIG. 5C.

FIG. 5C illustrates the set of location data shown in FIG. 5A (the input telematic data in this example). In FIG. 5C, a reference line 540 is defined between point 520 and end point 512 of the input telematic data. Further in FIG. 5C, a reference line 550 is defined between end point 510 and point 520 of the input telematic data. In the example of FIGS. 5A-5E, reference lines 540 and 550 are second and third reference lines of the set of iteratively-defined reference lines as mentioned above regarding acts 420, 422, 424, and 426.

In accordance with act 420 in method 400, reduced telematic data is generated by iteratively selecting data points from the input telematic data, based on differences of the data points to reference lines. In the scenario of FIG. 5C, for reference line 540, a minimum difference between respective data points (data points sequentially between point 520 and end point 512) and reference line 540 is determined, in accordance with act 422 of method 400.

Further, in accordance with act 424 of method 400, a data point of the input telematic data is identified, where a minimum difference between the data point and the reference line 540 is greater than a minimum difference between other data points (sequential points between points 520 and 512) and the reference line 540. That is, a data point of the input telematic data between points 520 and 512 is determined which is the most different from the reference line 540. In FIG. 5C, this data point is labelled as point 522, and the minimum difference between point 522 and reference line 550 is labelled as line 552.

Following identification of point 522, a determination is made as to whether the minimum difference between point 522 and reference line 540 exceeds a difference threshold, in accordance with act 426 of method 400. In FIG. 5C, a difference threshold is illustrated around reference line 540, shown as threshold lines 544 and 546. As can be seen in FIG. 5C, point 522 lies within threshold lines 544 and 546, and therefore the difference is within the difference threshold. Consequently, point 522 is not selected for inclusion in the reduced telematic data in accordance with act 426 of method 400. Further, because point 522 is the most different point from reference line 540 between points 520 and 512, every other point between points 520 and 512 is also within the difference threshold illustrated by threshold lines 544 and 546. Consequently, every point between points 520 and 512 is not selected for inclusion in the reduced telematic data. This is shown in FIG. 5C with these points being illustrated in white.

Further in the scenario of FIG. 5C, for reference line 550, a minimum difference between respective data points (data points sequentially between end point 510 and point 520) and reference line 550 is determined, in accordance with act 422 of method 400.

Further, in accordance with act 424 of method 400, a data point of the input telematic data is identified, where a minimum difference between the data point and the reference line 550 is greater than a minimum difference between other data points (sequential points between points 510 and 520) and the reference line 550. That is, a data point of the input telematic data between points 510 and 520 is identified which is the most different from the reference line 550. In FIG. 5C, this data point is labelled as point 524, with a difference from reference line 550 labelled as line 552.

Following identification of point 524, in accordance with act 426 of method 400, a determination is made as to whether the minimum difference between point 524 and reference line 550 exceeds a difference threshold. In FIG. 5C, a difference threshold is illustrated around reference line 550, shown as threshold lines 554 and 556. As can be seen in FIG. 5C, point 524 lies outside of threshold lines 554 and 556, and therefore the difference is greater than the difference threshold. Consequently, point 524 is selected for inclusion in the reduced telematic data as in act 414 of method 400.

Further in accordance with act 426 of method 400, the iteratively-defined reference lines are updated to include reference lines which intersect point 524, as is shown in FIG. 5D.

FIG. 5D illustrates the set of location data shown in FIG. 5A (the input telematic data in this example). In FIG. 5D, a reference line 560 is defined between end point 510 and point 524 of the input telematic data. Further in FIG. 5D, a reference line 570 is defined between point 524 and point 520 of the input telematic data. In the example of FIGS. 5A-5E, reference lines 560 and 570 are fourth and fifth reference lines of the set of iteratively-defined reference lines as mentioned above regarding acts 420, 422, 424, and 426.

In accordance with act 420 in method 400, reduced telematic data is generated by iteratively selecting data points from the input telematic data, based on differences of the data points to the iteratively-defined reference lines. In the scenario of FIG. 5C, for reference line 560, a minimum difference between respective data points (sequential data points between point 510 and point 524) and reference line 560 is determined, in accordance with act 422 of method 400.

Further, in accordance with act 424 of method 400, a data point of the input telematic data is identified, where a minimum difference between the data point and the reference line 560 is greater than a minimum difference between other data points (sequential points between points 510 and 524), and the reference line 560. That is, a data point of the input telematic data between points 510 and 524 is identified which is the most different from the reference line 560. In FIG. 5D, this data point is labelled as point 526.

Following identification of point 526, a determination is made as to whether the minimum difference between point 526 and reference line 560 exceeds a difference threshold. In FIG. 5D, a difference threshold is illustrated around reference line 560, shown as threshold lines 564 and 566. As can be seen in FIG. 5D, point 526 lies within threshold lines 564 and 566, and therefore the difference is within the difference threshold. Consequently, point 526 is not selected for inclusion in the reduced telematic data in act 426 of method 400. Further, because point 526 is the most different point from reference line 560 between points 510 and 524, every other point between points 510 and 524 is also within the difference threshold illustrated by threshold lines 564 and 566. Consequently, every point between points 510 and 524 is not selected for inclusion in the reduced telematic data. This is shown in FIG. 5D with these points being illustrated in white.

Further in the scenario of FIG. 5D, for reference line 570, a minimum difference between respective data points (data points sequentially between point 524 and point 520) and reference line 570 is determined, in accordance with act 422 of method 400.

Further, in accordance with act 424 of method 400, a data point of the input telematic data is identified, where a minimum difference between the data point and the reference line 570 is greater than a minimum difference between other data points (sequential points between points 524 and 520), and the reference line 570. That is, a data point of the input telematic data between points 524 and 520 is identified which is the most different from the reference line 570. In FIG. 5D, this data point is labelled as point 528.

Following identification of point 528, a determination is made as the whether the minimum difference between point 528 and reference line 570 exceeds a difference threshold, in accordance with act 426 of method 400. In FIG. 5D, a difference threshold is illustrated around reference line 570, shown as threshold lines 574 and 576. As can be seen in FIG. 5D, point 528 lies within threshold lines 574 and 576, and therefore the difference is within the difference threshold. Consequently, point 528 is not selected for inclusion in the reduced telematic data in act 426 of method 400. Further, because point 528 is the most different point from reference line 570 between points 524 and 520, every other point between points 524 and 520 is also within the difference threshold illustrated by threshold lines 574 and 576. Consequently, every point between points 524 and 520 is not selected for inclusion in the reduced telematic data. This is shown in FIG. 5D with these points being illustrated in white.

In FIG. 5D, the input telematic data has been reduced to points which indicate end points of respective reference lines. That is, in FIG. 5D, the input telematic data has been reduced from 24 data points to 4 data points. Reference lines 540, 560, and 570 between these 4 data points show a travel path of the vehicle which is accurate to an actual travel path of the vehicle (within the above discussed difference threshold), while requiring significantly less data points to indicate. In essence, the selected data points 510, 524, 520, and 512 illustrate inflection points, where a travel trajectory of the vehicle changes significantly enough to be of note, as discussed earlier.

The process of input telematic data reduction discussed with reference to FIGS. 5A-5D is called "curve logging", and is discussed in significant detail in U.S. Pat. No. 11,022,444, the entirety of which is incorporated by reference herein.

As mentioned, because the selected data points 510, 524, 520, and 512 illustrate inflection points of importance in travel of the vehicle, it can be desirable to synchronize other types of collected data for time periods around or proximate these inflection points. This is part of method 400, discussed earlier, and in more detail below. In particular, at 408 in method 400, the reduced telematic data is interpolated to generate interpolated telematic data at the synchronized data rate, for a threshold time period around each identified data point in the input telematic data. This is illustrated in FIG. 5E, and discussed in detail below.

FIG. 5E illustrates the set of location data shown in FIG. 5A (the input telematic data in this example), reduced to data points 510, 524, 520, and 512 as discussed with reference to FIGS. 5A-5D. FIG. 5E illustrates a plurality of times $T_0$, $T_1$, $T_2$, $T_3$, $T_4$, $T_5$, $T_6$, and $T_7$. Each of the times is shown at a position among the location data, indicating the position of the vehicle at that time (or at least, the interpreted position of the vehicle, which can be based on points 510, 524, 520, and 512, and/or reference lines 560, 570, or 540).

A time period between times $T_0$ and $T_1$ corresponds to a threshold time period around identified data point 510. The exact duration of this time period can be chosen as appropriate for a given application or implementation (by setting times $T_0$ and $T_1$), and could for example be ten seconds, 30 seconds, 1 minute, or any other longer or shorter duration of time. Throughout this disclosure, times (such as times $T_0$ and $T_1$) can be set manually, based on input from an operator. Alternatively, individual times (such as times $T_0$ and $T_1$) are determined by at least one processor. The individual times can be determined for example based on an operator input which specifies a duration of interest. Based on this duration of interest, the at least one processor selects individual times to cover the duration of interest, around a time of a data point. For example, in accordance with act 408 of method 400, the reduced telematic data is interpolated around data point 510, within the threshold time period defined by times $T_0$ and $T_1$, which can be set based on a duration of interest with respect to a timestamp of data point 510. Exemplary means for interpolation are discussed earlier, are applicable here, and are not repeated for brevity. As one example, interpolated telematic data points can be generated between $T_0$ and $T_1$ at the synchronized data rate, along reference line 560.

A time period between times $T_2$ and $T_3$ corresponds to a threshold time period around identified data point 524. Similar to as discussed above, the exact duration of this time period can be chosen as appropriate for a given application or implementation (by setting times $T_2$ and $T_3$). In accordance with act 408 of method 400, the reduced telematic data is interpolated around data point 524, within the threshold time period defined by times $T_2$ and $T_3$. Exemplary means for interpolation are discussed earlier, are applicable here, and are not repeated for brevity. As one example, interpolated telematic data points can be generated between $T_2$ and $T_3$ at the synchronized data rate, along reference lines 560 and 570.

A time period between times $T_4$ and $T_5$ corresponds to a threshold time period around identified data point 520. Similar to as discussed above, the exact duration of this time period can be chosen as appropriate for a given application or implementation (by setting times $T_4$ and $T_5$). In accordance with act 408 of method 400, the reduced telematic data is interpolated around data point 520, within the threshold time period defined by times $T_4$ and $T_5$. Exemplary means for interpolation are discussed earlier, are applicable here, and are not repeated for brevity. As one example, interpolated telematic data points can be generated between $T_4$ and $T_5$ at the synchronized data rate, along reference lines 570 and 580.

A time period between times $T_6$ and $T_7$ corresponds to a threshold time period around identified data point 512. Similar to as discussed above, the exact duration of this time period can be chosen as appropriate for a given application or implementation (by setting times $T_6$ and $T_7$). In accordance with act 408 of method 400, the reduced telematic data is interpolated around data point 512, within the threshold time period defined by times $T_6$ and $T_7$. Exemplary means for interpolation are discussed earlier, are applicable here, and are not repeated for brevity. As one example, interpolated telematic data points can be generated between $T_6$ and $T_7$ at the synchronized data rate, along reference line 540.

FIG. 5F shows the interpolated telematic data generated in accordance with act 408 of method 400. In particular, FIG. 5F shows data points 510, 524, 520, and 512, as included in the reduced telematic data discussed with reference to FIGS. 5A-5E. Further 5F also shows a plurality of data points (illustrated as black dots; not individually labelled to reduce clutter) between time $T_0$ and time $T_1$ (the threshold time period around data point 510), which are generated (interpolated) data points, in accordance with act 408 of method 400. Further 5F also shows a plurality of data points (illustrated as black dots; not individually labelled to reduce clutter) between time $T_2$ and time $T_3$ (the threshold time period around data point 524), which are generated (interpolated) data points, in accordance with act 408 of method 400. Further 5F also shows a plurality of data points (illustrated as black dots; not individually labelled to reduce clutter) between time $T_4$ and time $T_5$ (the threshold time period around data point 520), which are generated (interpolated) data points, in accordance with act 408 of method 400. Further 5F also shows a plurality of data points (illustrated as black dots; not individually labelled to reduce clutter) between time $T_6$ and time $T_7$ (the threshold time period around data point 512), which are generated (interpolated) data points, in accordance with act 408 of method 400.

FIG. 5G shows a plot 590 illustrating interpolated data (telematic data and image data) generated in accordance with acts 206 and 408 of method 400. In the example of FIG. 5G, the telematic data includes the interpolated location data generated in accordance with FIGS. 5A-5F discussed above. The interpolated video data is generated in accordance with act 206 of method 400 by interpolating the input video data in the same threshold time periods shown in FIGS. 5E and 5F. The data points included in the interpolated telematic data and video data are illustrated as black dots, and are not individually labelled to reduce clutter. The interpolated video data and interpolated telematic data are at the synchronized data rate, as in method 400.

As discussed earlier, in accordance with act 410 in method 400, the interpolated video data and the interpolated telematic data are sampled at the sample rate in the threshold time periods. In the example of FIGS. 5E-5G, the interpolated video data and the interpolated telematic data are sampled between times $T_0$ and $T_1$, between times $T_2$ and $T_3$, between times $T_4$ and $T_5$, and between times $T_6$ and $T_7$. Further as discussed earlier, in accordance with act 212 of method 400, the sampled video data and sampled telematic data are output as synchronized video and telematic data at the sample rate, for each of the above discussed time periods. Consequently, synchronized video and telematic data is generated at the sample rate, around each of data points 510, 524, 520, and 512. In this way, synchronized video and telematic data is generated around each inflection point in travel of the vehicle. Since each inflection point is more likely to represent a point of interest in the data (compared to other data points where the trajectory of the vehicle is unchanged), this synchronized data represents a meaningful and helpful balance, where quantity of data is generally reduced (by not reporting or keeping data unlikely to be of interest), but data density (frequency of data) is reported or maintained around times where such data is more likely to be of interest.

FIGS. 5A-5G illustrate one exemplary scenario where method 400 of FIG. 4 is implemented, with a focus on location data. However, method 400 is applicable to any form of telematic data. In this regard, FIGS. 6A-6H illustrate another exemplary scenario for data types other than location data (such as speed data or acceleration data).

Figure 6A:
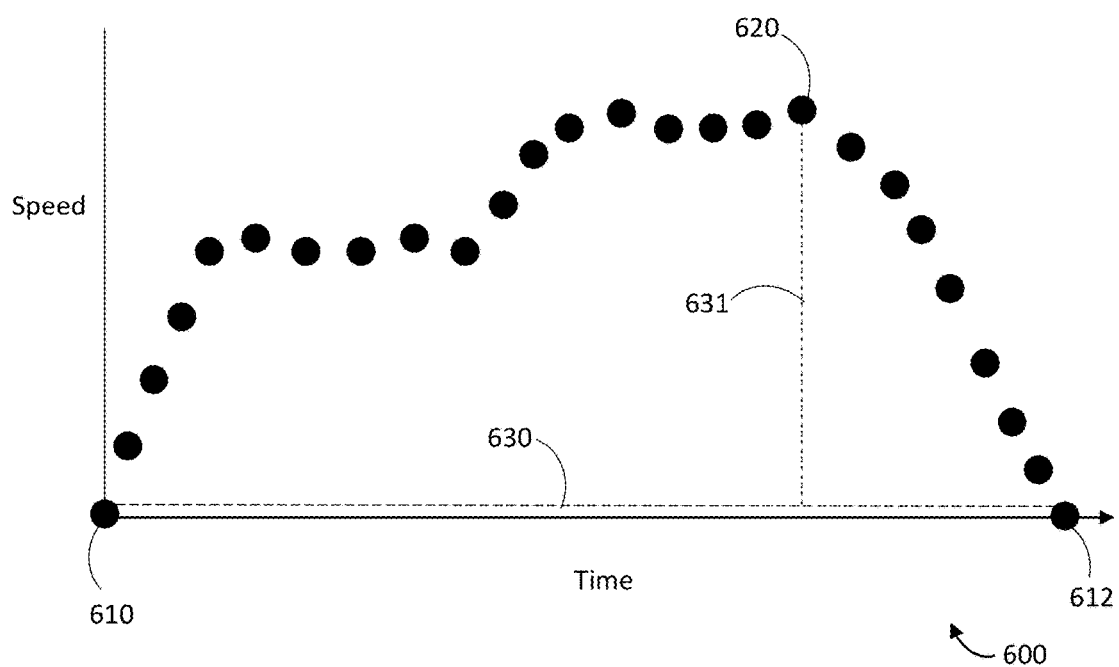
FIGS. 6A, 6B, 6C, 6D, and 6E are plots which illustrate another exemplary scenario where reduced telematic data is generated from input telematic data.

FIG. 6A is an exemplary plot which illustrates an exemplary set of input telematic data. FIGS. 6A, 6B, 6C, 6D, and 6E are plots which illustrate an exemplary process for generating reduced telematic data from the input telematic data shown in FIG. 6A (an example of act 420 and sub-acts 422, 424, and 426 in method 400 of FIG. 4). FIGS. 6F and 6G are plots which illustrate an exemplary process for interpolating the reduced telematic data (an example of act 408 in method 400). FIG. 6H is a plot which illustrates interpolated telematic data and video data. In the case of FIGS. 6A-6H, the input telematic data includes speed data of a vehicle, though the discussion of FIGS. 6A-6H applies to other types of data as well.

FIG. 6A illustrates speed data collected as a vehicle travels (such as any of vehicles 114 discussed with reference to FIG. 1). A telematic monitoring device (such as telematic monitoring device 104 discussed with reference to FIG. 1) captures the speed data indicating speed (or velocity) of the vehicle as the vehicle travels. In the example of FIG. 6A each black circle represents a point of speed data included by the telematic monitoring device in the captured input telematic data. Similar to as discussed above regarding location data (and as applicable to any type of telematic data), what is meant by "included by the telematic monitoring device in the captured input telematic data" can have various meanings as appropriate for a given application. In some implementations, every point of speed data captured by the telematic monitoring device can be included in the input telematic data. In other implementations, captured speed data can be filtered to eliminate outlying data points from the input telematic data. For example, data points which are too far from adjacent data points to be physically possible for the vehicle (e.g. impossible acceleration by the vehicle) can be filtered out, as these data points typically represent sensor errors, communication errors, or other errors. As another example, data points which are outside of reasonable boundaries (e.g. speeds exceeding a top speed of the vehicle) can as be filtered out for similar reasons. As another example, data points which are dissimilar from a pattern of other data points (anomalous data points) can also be filtered out for similar reasons.

In the example of FIGS. 6A-6H, the telematic data being discussed includes speed data, such that a "difference" between a given data point and a reference line represents a difference in speed represented by the data point and represented by the reference line. In this way, selecting data points from the input telematic data for inclusion in the reduced telematic data, based on differences of the data points to iteratively-defined reference lines defined through portions of the input telematic data (as in act 420 of method 400) includes selecting data points from the input telematic data for inclusion in the reduced telematic data, based on differences in speed between speeds represented by the data points to iteratively-defined reference lines defined through portions of the speed data.

Each point of speed data in FIGS. 6A-6F is not expressly labelled, to reduce clutter. Generally, however, speed data illustrated as a black circle indicates speed data which is not (or has not yet been) excluded from the reduced telematic data in accordance with act 420 of method 400. Speed data which has been excluded from the reduced telematic data is illustrated as white circles in FIGS. 6B-6F.

FIG. 6A also illustrates reduction of the set of speed data (the input telematic data in this example). In FIG. 6A, a reference line 630 is defined between end points 610 and 612 of the input telematic data. In the example of FIGS. 6A-6H, reference line 630 is a first reference line of a set of iteratively-defined reference lines as mentioned above regarding acts 420, 422, 424, and 426. End points 620 and 612 can be defined in various ways. In some implementations, end points 610 and 612 can be defined as the start and end, respectively, of a trip or journey by the vehicle (e.g. when the vehicle is activated or moved, until the vehicle is deactivated or stops moving). In some implementations, end points 610 and 612 can be defined as the start and end, respectively, of a region of data of interest. For example, a user can provide input indicating that the data from point 610 to point 612 is of interest, and the generation of reduced telematic data is performed over this region of interest. What is considered a region of "interest" is highly application and situation specific, and could for example refer to a region where reduction of telematic data is considered likely to be effective (e.g. journeys over long, straight roads).

In accordance with act 420 in method 400, reduced telematic data is generated by selecting data points from the input telematic data, based on differences of the data points to reference lines. In the scenario of FIG. 6A, a minimum difference between respective data points (data points sequentially between end points 610 and 612) and reference line 630 is determined, in accordance with act 422 of method 400.

Further, in accordance with act 424 of method 400, a data point of the input telematic data is identified, where a minimum difference between the data point and the reference line 630 is greater than a minimum difference between other data points being compared (sequential points between points 610 and 612) and the reference line 630. That is, a data point of the input telematic data between points 610 and 612 is identified which is the most different from the reference line 630. In FIG. 6A, this data point is labelled as point 620, with the minimum difference between point 620 and reference line 630 illustrated by line 631 (perpendicular to reference line 630).

Following identification of point 620, a determination is made as the whether the minimum difference between point 620 and reference line 630 exceeds a difference threshold. In FIG. 6A, a specific difference threshold is not illustrated around reference line 630 to reduce clutter, but point 620 lies a great distance from reference line 630 (line 632 is quite long), outside of said difference threshold. Consequently, point 620 is selected for inclusion in the reduced telematic data as in act 426 of method 400.

Figure 6B:
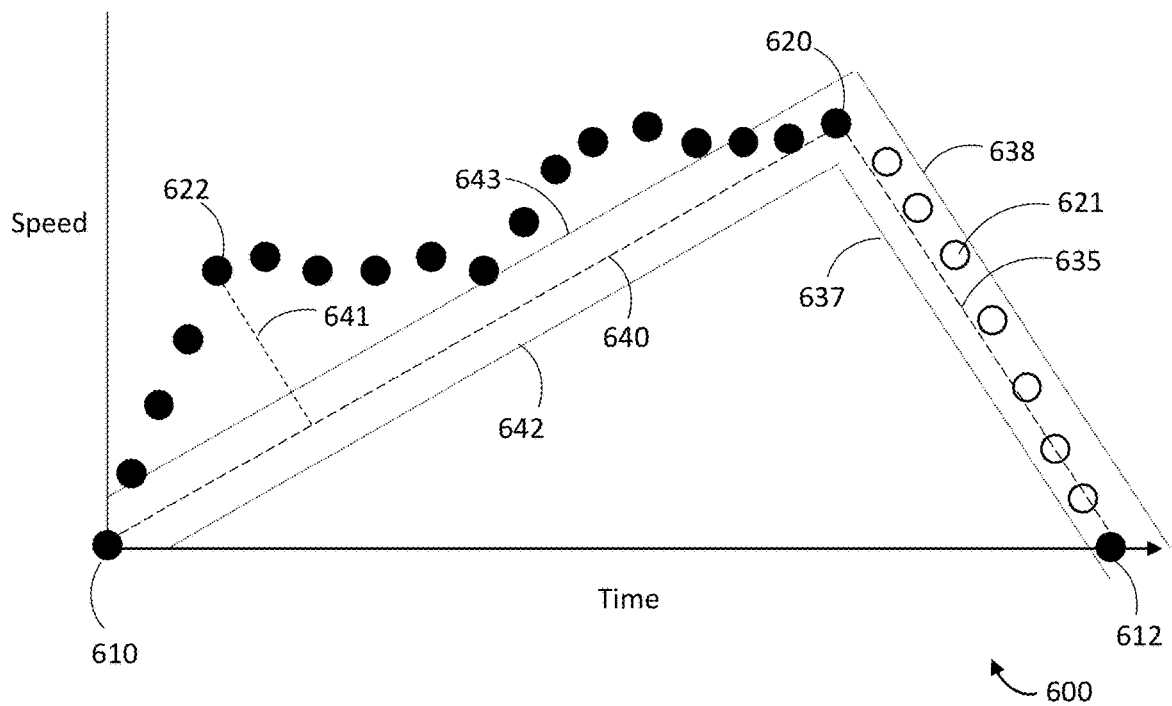

Further in accordance with act 426 of method 400, the iteratively-defined reference lines are updated to include reference lines which intersect point 620, as is shown in FIG. 6B.

FIG. 6B illustrates the set of speed data shown in FIG. 6A (the input telematic data in this example). In FIG. 6B, a reference line 635 is defined between point 620 and end point 612 of the input telematic data. Further in FIG. 6B, a reference line 640 is defined between end point 610 and point 620 of the input telematic data. In the example of FIGS. 6A-6H, reference lines 635 and 640 are second and third reference lines of the set of iteratively-defined reference lines as mentioned above regarding acts 420, 422, 424, and 426.

In accordance with act 420 in method 400, reduced telematic data is generated by selecting data points from the input telematic data, based on differences of the data points to reference lines. In the scenario of FIG. 6B, for reference line 635, a minimum difference between respective data points (data points sequentially between point 620 and 612) and reference line 635 is determined, in accordance with act 422 of method 400.

Further, in accordance with act 424 of method 400, a data point of the input telematic data is identified, where a minimum difference between the data point and the reference line 635 is greater than a minimum difference between other data points being compared (sequential data points between points 620 and 612) and the reference line 635. That is, a data point of the input telematic data between points 620 and 612 is identified which is the most different from the reference line 635. In FIG. 6B, this data point is labelled as point 621.

Following identification of point 621, a determination is made as to whether the minimum difference between point 621 and reference line 635 exceeds a difference threshold. In FIG. 6B, a difference threshold is illustrated around reference line 635, shown as threshold lines 637 and 638. As can be seen in FIG. 6B, point 621 lies within threshold lines 637 and 638, and therefore the minimum difference is within the difference threshold. Consequently, point 621 is not selected for inclusion in the reduced telematic data as in act 426 of method 400. Further, because point 621 is the most different point from reference line 635 between points 620 and 612, every other point between points 620 and 612 is also within the difference threshold illustrated by threshold lines 637 and 638. Consequently, every point between points 620 and 612 is not selected for inclusion in the reduced telematic data. This is shown in FIG. 6B with these points being illustrated in white.

Further in the scenario of FIG. 6B, for reference line 640 in FIG. 6B, a minimum difference between respective data points (data points sequentially between end point 610 and point 620) and reference line 640 is determined, in accordance with act 422 of method 400.

Further, in accordance with act 424 of method 400, a data point of the input telematic data is identified, where a minimum difference between the data point and the reference line 640 is greater than a minimum difference between other data points being compared (sequential data points between points 610 and 620) and the reference line 640. That is, a data point of the input telematic data between points 610 and 620 is determined which is the most different from the reference line 640. In FIG. 6B, this data point is labelled as point 622, and the minimum distance between point 622 and reference line 640 is labelled as line 641.

Following determination of point 622, a determination is made as the whether the minimum difference between point 622 and reference line 640 exceeds a difference threshold. In FIG. 6B, a difference threshold is illustrated around reference line 640, shown as threshold lines 642 and 643. As can be seen in FIG. 6B, point 622 lies outside of threshold lines 642 and 643, and therefore the difference is greater than the difference threshold. Consequently, point 622 is selected for inclusion in the reduced telematic data as in act 426 of method 400.

Figure 6C:
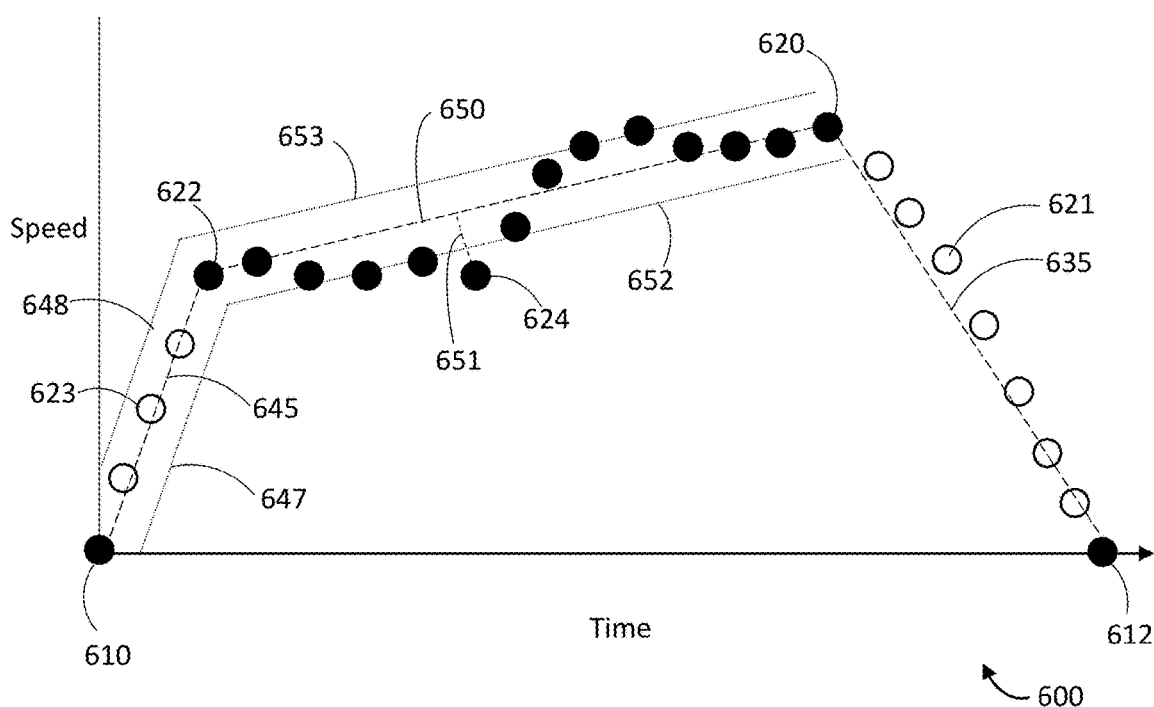

Further in accordance with act 426 of method 400, the iteratively-defined reference lines are updated to include reference lines which intersect point 622, as is shown in FIG. 6C.

FIG. 6C illustrates the set of speed data shown in FIG. 6A (the input telematic data in this example). In FIG. 6C, a reference line 645 is defined between end point 610 and point 622 of the input telematic data. Further in FIG. 6C, a reference line 650 is defined between point 622 and point 620 of the input telematic data. In the example of FIGS. 6A-6H, reference lines 645 and 650 are fourth and fifth reference lines of the set of iteratively-defined reference lines as mentioned above regarding acts 420, 422, 424, and 426.

In accordance with act 420 in method 400, reduced telematic data is generated by selecting data points from the input telematic data, based on differences of the data points to reference lines. In the scenario of FIG. 6C, for reference line 645, a minimum difference between respective data points (data points sequentially between point 610 and point 622) and reference line 645 is determined, in accordance with act 422 of method 400.

Further, in accordance with act 424 of method 400, a data point of the input telematic data is identified, where a minimum difference between the data point and the reference line 645 is greater than a minimum difference between other data points being compared (sequential points between points 610 and 622) and the reference line 645. That is, a data point of the input telematic data between points 610 and 622 is identified which is the most different from the reference line 645. In FIG. 6C, this data point is labelled as point 623.

Following determination of point 623, a determination is made as the whether the minimum difference between point 623 and reference line 645 exceeds a difference threshold. In FIG. 6C, a difference threshold is illustrated around reference line 645, shown as threshold lines 647 and 648. As can be seen in FIG. 6C, point 623 lies within threshold lines 647 and 648, and therefore the difference is within the difference threshold. Consequently, point 623 is not selected for inclusion in the reduced telematic data as in act 426 of method 400. Further, because point 623 is the most different point from reference line 645 between points 610 and 622, every other point between points 610 and 622 is also within the difference threshold illustrated by threshold lines 647 and 648. Consequently, every point between points 610 and 622 is not selected for inclusion in the reduced telematic data. This is shown in FIG. 6C with these points being illustrated in white.

Further in the scenario of FIG. 6C, for reference line 650, a minimum difference between respective data points (data points sequentially between points 622 and 620) and reference line 650 is determined, in accordance with act 422 of method 400.

Further, in accordance with act 424 of method 400, a data point of the input telematic data is identified, where a minimum difference between the data point and the reference line 650 is greater than a minimum difference between other data points being compared (sequential points between points 622 and 620) and the reference line 650. That is, a data point of the input telematic data between points 622 and 620 is identified which is the most different from the reference line 650. In FIG. 6C, this data point is labelled as point 624, with a distance from reference line 650 labelled as line 651.

Following determination of point 624, a determination is made as to whether the minimum difference between point 624 and reference line 650 exceeds a difference threshold. In FIG. 6C, a difference threshold is illustrated around reference line 650, shown as threshold lines 652 and 653. As can be seen in FIG. 6C, point 624 lies outside of threshold lines 652 and 653, and therefore the difference is greater than the difference threshold. Consequently, point 624 is selected for inclusion in the reduced telematic data as in act 426 of method 400.

Figure 6D:
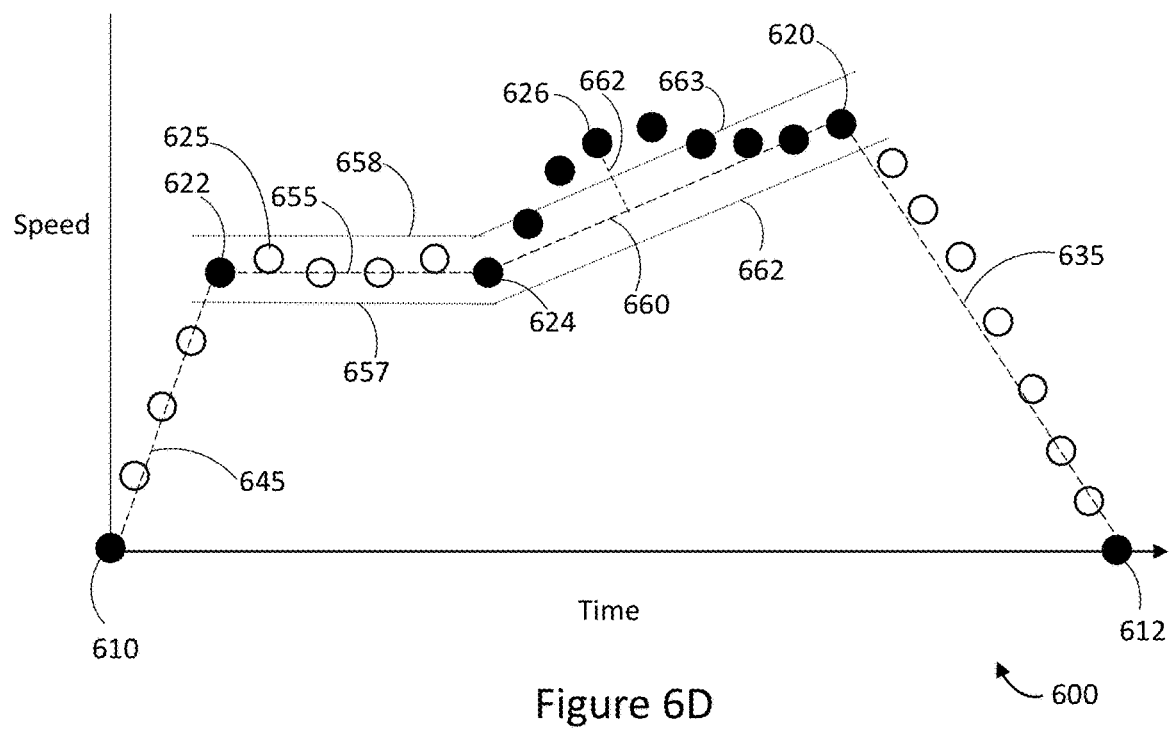

Further in accordance with act 426 of method 400, the iteratively-defined reference lines are updated to include reference lines which intersect point 624, as is shown in FIG. 6D.

FIG. 6D illustrates the set of speed data shown in FIG. 6A (the input telematic data in this example). In FIG. 6D, a reference line 655 is defined between point 622 and point 624 of the input telematic data. Further in FIG. 6D, a reference line 660 is defined between point 624 and point 620 of the input telematic data. In the example of FIGS. 6A-6H, reference lines 655 and 660 are sixth and seventh reference lines of the set of iteratively-defined reference lines as mentioned above regarding acts 420, 422, 424, and 426.

In accordance with act 420 in method 400, reduced telematic data is generated by selecting data points from the input telematic data, based on differences of the data points to reference lines. In the scenario of FIG. 6D, for reference line 655, a minimum difference between respective data points (data points sequentially between point 622 and point 624) and reference line 655 is determined, in accordance with act 422 of method 400.

Further, in accordance with act 424 of method 400, a data point of the input telematic data is identified, where a minimum difference between the data point and the reference line 655 is greater than a minimum difference between other data points being compared (sequential points between points 622 and 624) and the reference line 655. That is, a data point of the input telematic data between points 622 and 624 is identified which is the most different from the reference line 655. In FIG. 6D, this data point is labelled as point 625.

Following identification of point 625, a determination is made as the whether the minimum difference between point 625 and reference line 655 exceeds a difference threshold. In FIG. 6D, a difference threshold is illustrated around reference line 655, shown as threshold lines 657 and 658. As can be seen in FIG. 6D, point 625 lies within threshold lines 657 and 658, and therefore the difference is within the difference threshold. Consequently, point 625 is not selected for inclusion in the reduced telematic data in act 426 of method 400. Further, because point 625 is the most different point from reference line 655 between points 622 and 624, every other point between points 622 and 624 is also within the difference threshold illustrated by threshold lines 657 and 658. Consequently, every point between points 622 and 624 is not selected for inclusion in the reduced telematic data. This is shown in FIG. 6D with these points being illustrated in white.

Further in the scenario of FIG. 6D, for reference line 660 in FIG. 6D, a data point of the input telematic data is identified, where a minimum difference between the data point and the reference line 660 is greater than a minimum difference between other data points being compared (sequential points between points 624 and 620) and the reference line 660. That is, a data point of the input telematic data between points 624 and 620 is identified which is the most different from the reference line 660. In FIG. 6D, this data point is labelled as point 626, with a difference between point 626 and reference line 660 labelled as line 662.

Following identification of point 626, a determination is made as to whether the minimum difference between point 626 and reference line 660 exceeds a difference threshold. In FIG. 6D, a difference threshold is illustrated around reference line 660, shown as threshold lines 662 and 663. As can be seen in FIG. 6D, point 626 lies outside of threshold lines 662 and 663, and therefore the difference is greater than the difference threshold. Consequently, point 626 is selected for inclusion in the reduced telematic data as in act 426 of method 400.

Figure 6E:
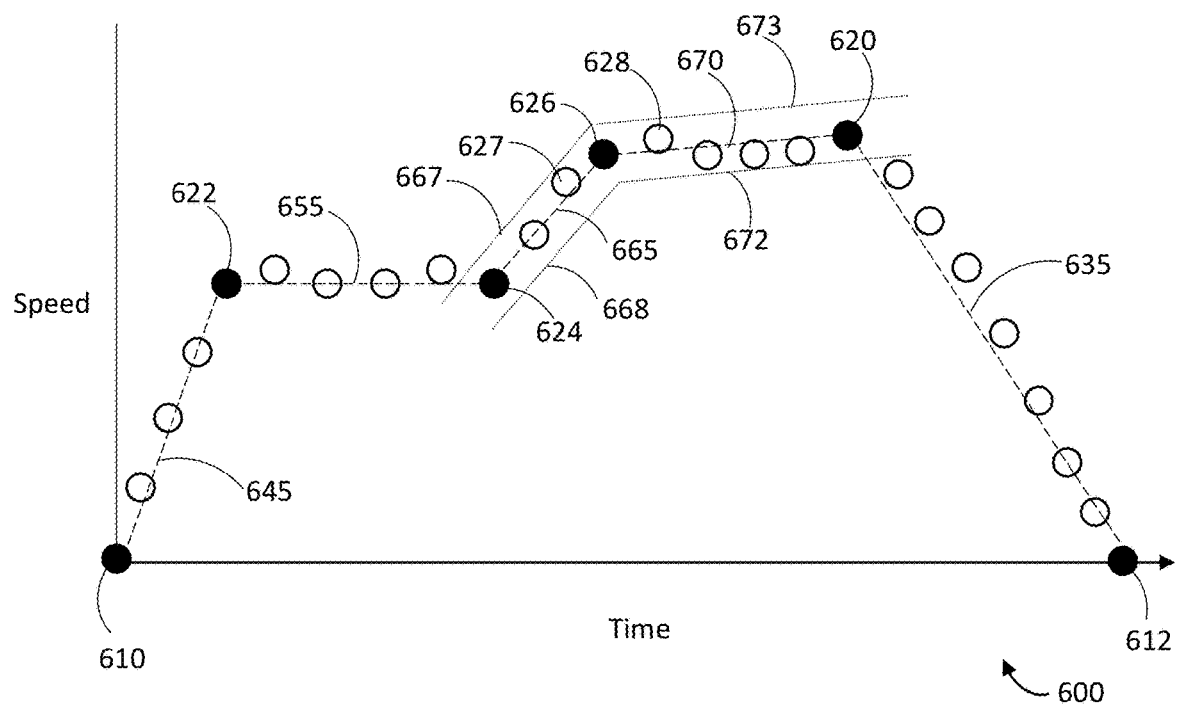
Figure 6F:
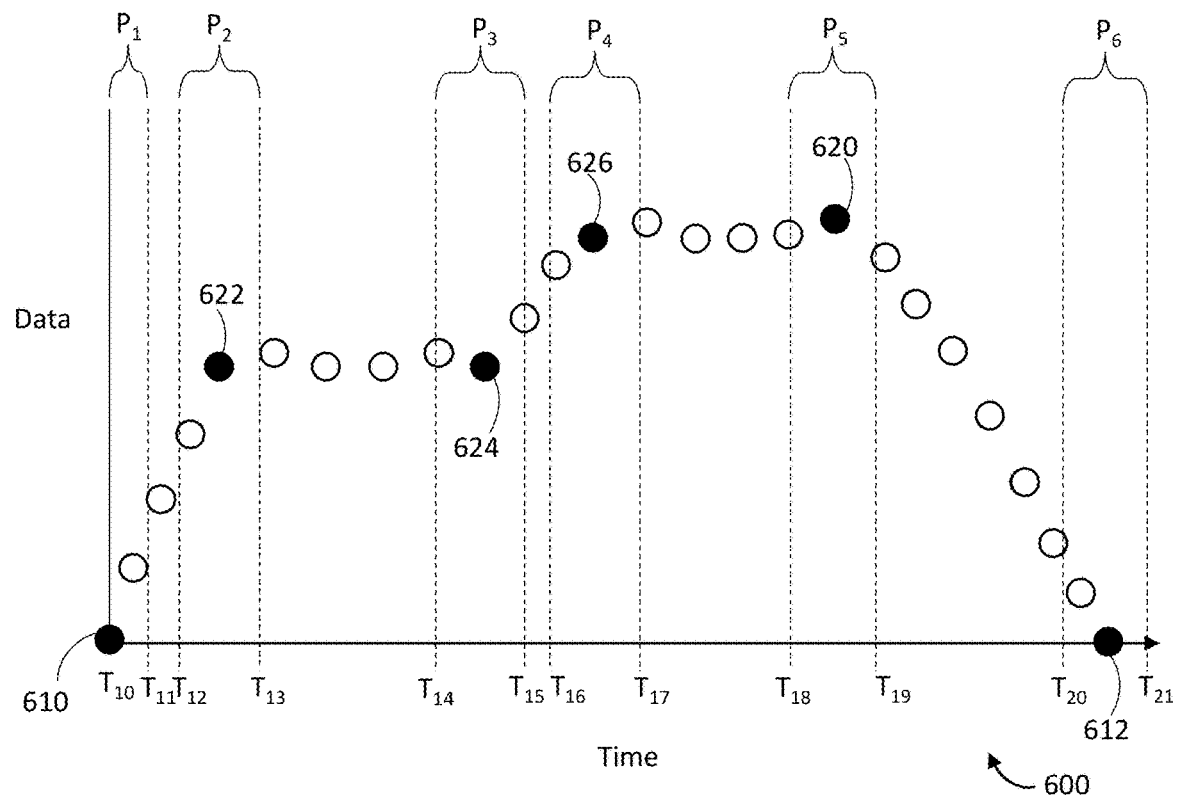
FIGS. 6F, 6G, and 6H are plots which illustrate an exemplary scenario where interpolated telematic data is generated in threshold time periods based on reduced telematic data.
Figure 6G:
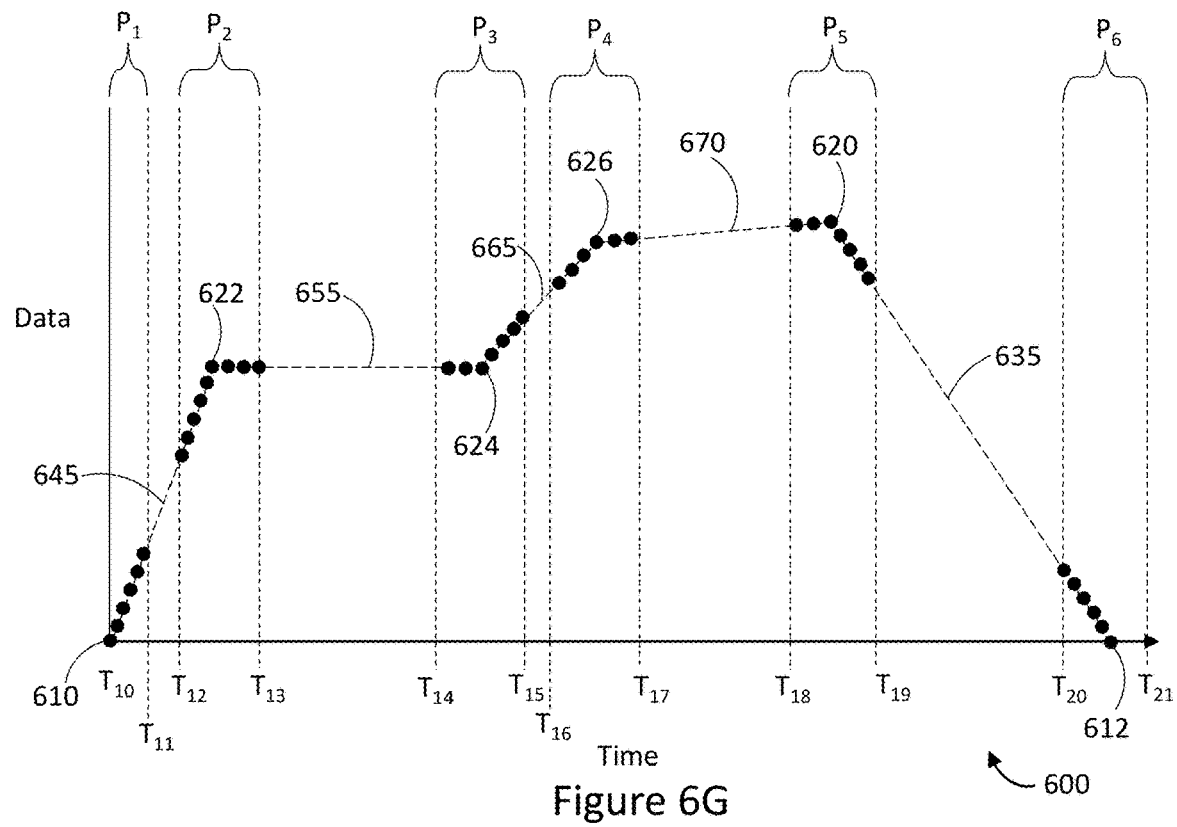
Figure 6H:
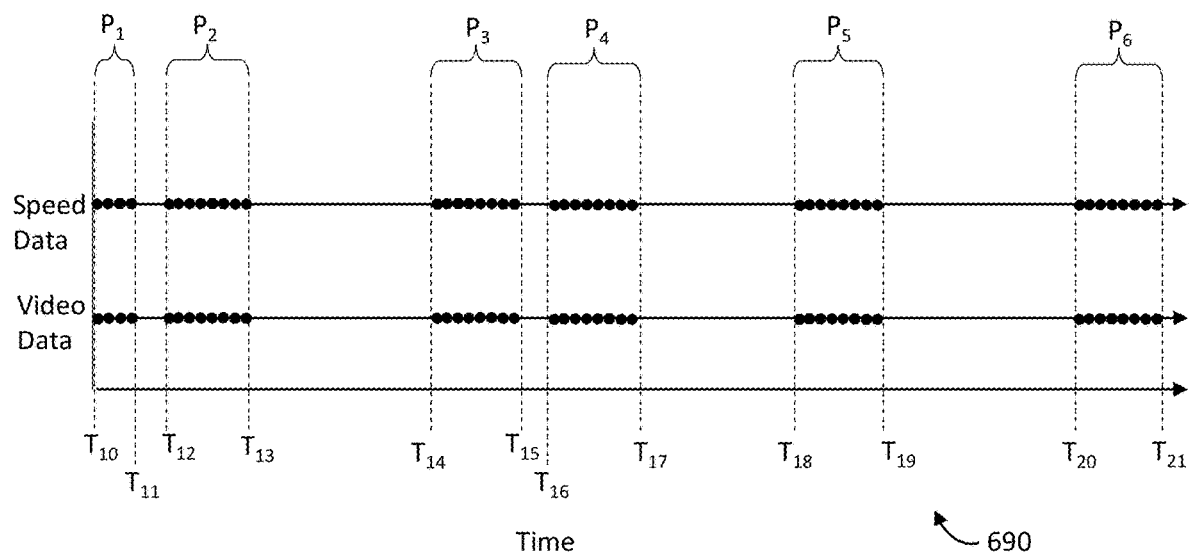

Further in accordance with act 426 of method 400, the iteratively-defined reference lines are updated to include reference lines which intersect point 626, as is shown in FIG. 6E.

FIG. 6E illustrates the set of speed data shown in FIG. 6A (the input telematic data in this example). In FIG. 6E, a reference line 665 is defined between point 624 and point 626 of the input telematic data. Further in FIG. 6E, a reference line 670 is defined between point 626 and point 620 of the input telematic data. In the example of FIGS. 6A-6H, reference lines 665 and 670 are eighth and ninth reference lines of the set of iteratively-defined reference lines as mentioned above regarding acts 420, 422, 424, and 426.

In accordance with act 420 in method 400, reduced telematic data is generated by selecting data points from the input telematic data, based on differences of the data points to the iteratively-defined reference lines. In the scenario of FIG. 6E, for reference line 665, a minimum difference between respective data points (data points sequentially between point 624 and point 626) and reference line 665 is determined, in accordance with act 422 of method 400.

Further, in accordance with act 424 of method 400, a data point of the input telematic data is identified, where a minimum difference between the data point and the reference line 665 is greater than a minimum difference between other data points being compared (sequential points between points 624 and 626), and the reference line 665. That is, a data point of the input telematic data between points 624 and 626 is determined which is the most different from the reference line 665. In FIG. 6E, this data point is labelled as point 627.

Following identification of point 627, a determination is made as the whether the minimum difference between point 627 and reference line 665 exceeds a difference threshold. In FIG. 6E, a difference threshold is illustrated around reference line 665, shown as threshold lines 667 and 668. As can be seen in FIG. 6E, point 627 lies within threshold lines 667 and 668, and therefore the difference is within the difference threshold. Consequently, point 627 is not selected for inclusion in the reduced telematic data in act 426 of method 400. Further, because point 627 is the most different point from reference line 665 between points 624 and 626, every other point between points 624 and 626 is also within the difference threshold illustrated by threshold lines 624 and 626. Consequently, every point between points 624 and 626 is not selected for inclusion in the reduced telematic data. This is shown in FIG. 6E with these points being illustrated in white.

Further in the scenario of FIG. 6E, for reference line 670, a data point of the input telematic data is identified, where a minimum difference between the data point and the reference line 670 is greater than a minimum difference between other data points being compared (sequential points between points 626 and 620), and the reference line 670. That is, a data point of the input telematic data between points 626 and 620 is identified which is the most different from the reference line 670. In FIG. 6E, this data point is labelled as point 628.

Following identification of point 628, a determination is made as the whether the minimum difference between point 628 and reference line 670 exceeds a difference threshold. In FIG. 6E, a difference threshold is illustrated around reference line 670, shown as threshold lines 672 and 673. As can be seen in FIG. 6E, point 628 lies within threshold lines 672 and 673, and therefore the difference is within the difference threshold. Consequently, point 628 is not selected for inclusion in the reduced telematic data in act 426 of method 400. Further, because point 628 is the most different point from reference line 670 between points 626 and 620, every other point between points 626 and 620 is also within the difference threshold illustrated by threshold lines 672 and 673. Consequently, every point between points 626 and 620 is not selected for inclusion in the reduced telematic data. This is shown in FIG. 6E with these points being illustrated in white.

In FIG. 6E, the input telematic data has been reduced to points which indicate end points of respective reference lines. That is, in FIG. 6E, the input telematic data has been reduced from 26 data points to 6 data points. Reference lines 645, 655, 665, 670, and 635 between these 6 data points show a piece-wise speed plot of the vehicle which approximates actual speed during travel of the vehicle (within the above discussed difference thresholds), while requiring significantly less data points to illustrate. In essence, the selected data points 610, 622, 624, 626, 620, and 612 illustrate inflection points, where a speed of the vehicle changes significantly enough to be of note.

The process of input telematic data reduction discussed with reference to FIGS. 6A-6E is also called "curve logging", and is discussed in significant detail in U.S. Pat. No. 11,022,444, the entirety of which is incorporated by reference herein.

As mentioned, because the selected data points 610, 622, 624, 626, 620, and 612 illustrate inflection points of importance in speed of the vehicle, it can be desirable to synchronize other types of collected data for time periods around or proximate these inflection points. This is part of method 400, discussed earlier, and in more detail below. In particular, at 408 in method 400, the reduced telematic data is interpolated to generate interpolated telematic data at the synchronized data rate, for a threshold time period around each identified data point in the input telematic data. This is illustrated in FIG. 6F, and discussed in detail below.

FIG. 6F illustrates the set of speed data 600 shown in FIG. 6A (the input telematic data in this example), reduced to data points 610, 622, 624, 626, 620, and 612 as discussed with reference to FIGS. 6A-6E. FIG. 6F illustrates a plurality of times $T_{10}$, $T_{11}$, $T_{12}$, $T_{13}$, $T_{14}$, $T_{15}$, $T_{16}$, $T_{17}$, $T_{18}$, $T_{19}$, $T_{20}$, and $T_{21}$.

A time period $P_1$ is shown between times $T_{10}$ and $T_{11}$ which corresponds to a threshold time period around identified data point 610. The exact duration of time period $P_1$ can be chosen as appropriate for a given application or implementation (by setting times $T_{10}$ and $T_{11}$), and could for example be ten seconds, 30 seconds, 1 minute, or any other longer or shorter duration of time. In accordance with act 408 of method 400, the reduced telematic data is interpolated around data point 610, within the threshold time period $P_1$ defined by times $T_0$ and $T_1$. Exemplary means for interpolation are discussed earlier, are applicable here, and are not repeated for brevity. As one example, interpolated telematic data points can be generated between $T_0$ and $T_1$ at the synchronized data rate, along reference line 645 shown in FIG. 6E.

A time period $P_2$ between times $T_{12}$ and $T_{13}$ corresponds to a threshold time period around identified data point 622. Similar to as discussed above, the exact duration of this time period can be chosen as appropriate for a given application or implementation (by setting times $T_{12}$ and $T_{13}$). In accordance with act 408 of method 400, the reduced telematic data is interpolated around data point 622, within the threshold time period defined by times $T_{12}$ and $T_{13}$. Exemplary means for interpolation are discussed earlier, are applicable here, and are not repeated for brevity. As one example, interpolated telematic data points can be generated between $T_{12}$ and $T_{13}$ at the synchronized data rate, along reference lines 645 and 655 shown in FIG. 6E.

A time period $P_3$ between times $T_{14}$ and $T_{15}$ corresponds to a threshold time period around identified data point 624. Similar to as discussed above, the exact duration of this time period can be chosen as appropriate for a given application or implementation (by setting times $T_{14}$ and $T_{15}$). In accordance with act 408 of method 400, the reduced telematic data is interpolated around data point 624, within the threshold time period $P_3$ defined by times $T_{14}$ and $T_{15}$. Exemplary means for interpolation are discussed earlier, are applicable here, and are not repeated for brevity. As one example, interpolated telematic data points can be generated between $T_{14}$ and $T_{15}$ at the synchronized data rate, along reference lines 655 and 665.

A time period $P_4$ between times $T_{16}$ and $T_{17}$ corresponds to a threshold time period around identified data point 626. Similar to as discussed above, the exact duration of this time period $P_4$ can be chosen as appropriate for a given application or implementation (by setting times $T_{16}$ and $T_{17}$). In accordance with act 408 of method 400, the reduced telematic data is interpolated around data point 626, within the threshold time period defined by times $T_{16}$ and $T_{17}$. Exemplary means for interpolation are discussed earlier, are applicable here, and are not repeated for brevity. As one example, interpolated telematic data points can be generated between $T_{16}$ and $T_{17}$ at the synchronized data rate, along reference lines 665 and 670.

A time period $P_5$ between times $T_{18}$ and $T_{19}$ corresponds to a threshold time period around identified data point 620. Similar to as discussed above, the exact duration of this time period $P_5$ can be chosen as appropriate for a given application or implementation (by setting times $T_{18}$ and $T_{19}$). In accordance with act 408 of method 400, the reduced telematic data is interpolated around data point 620, within the threshold time period defined by times $T_{18}$ and $T_{19}$. Exemplary means for interpolation are discussed earlier, are applicable here, and are not repeated for brevity. As one example, interpolated telematic data points can be generated between $T_{18}$ and $T_{19}$ at the synchronized data rate, along reference lines 670 and 635.

A time period $P_6$ between times $T_{20}$ and $T_{21}$ corresponds to a threshold time period around identified data point 612. Similar to as discussed above, the exact duration of this time period $P_6$ can be chosen as appropriate for a given application or implementation (by setting times $T_{20}$ and $T_{21}$). In accordance with act 408 of method 400, the reduced telematic data is interpolated around data point 612, within the threshold time period defined by times $T_{20}$ and $T_{21}$. Exemplary means for interpolation are discussed earlier, are applicable here, and are not repeated for brevity. As one example, interpolated telematic data points can be generated between $T_{20}$ and $T_{21}$ at the synchronized data rate, along reference line 635.

FIG. 6G shows the interpolated telematic data generated in accordance with act 408 of method 400. In particular, FIG. 6G shows data points 610, 622, 624, 626, 620, and 612, as included in the reduced telematic data discussed with reference to FIGS. 6A-6F. FIG. 6G also shows a plurality of data points (illustrated as black dots; not individually labelled to reduce clutter) between time $T_{10}$ and time $T_{11}$ (the threshold time period $P_1$ around data point 610), which are generated (interpolated) data points, in accordance with act 408 of method 400. FIG. 6G also shows a plurality of data points (illustrated as black dots; not individually labelled to reduce clutter) between time $T_{12}$ and time $T_{13}$ (the threshold time period $P_2$ around data point 622), which are generated (interpolated) data points, in accordance with act 408 of method 400. FIG. 6G also shows a plurality of data points (illustrated as black dots; not individually labelled to reduce clutter) between time $T_{14}$ and time $T_{15}$ (the threshold time period $P_3$ around data point 624), which are generated (interpolated) data points, in accordance with act 408 of method 400. FIG. 6G also shows a plurality of data points (illustrated as black dots; not individually labelled to reduce clutter) between time $T_{16}$ and time $T_{17}$ (the threshold time period $P_4$ around data point 626), which are generated (interpolated) data points, in accordance with act 408 of method 400. FIG. 6G also shows a plurality of data points (illustrated as black dots; not individually labelled to reduce clutter) between time $T_{18}$ and time $T_{19}$ (the threshold time period $P_5$ around data point 620), which are generated (interpolated) data points, in accordance with act 408 of method 400. FIG. 6G also shows a plurality of data points (illustrated as black dots; not individually labelled to reduce clutter) between time $T_{20}$ and time $T_{21}$ (the threshold time period $P_6$ around data point 612), which are generated (interpolated) data points, in accordance with act 408 of method 400.

FIG. 6H shows a plot 690 illustrating interpolated data (telematic data and image data) generated in accordance with acts 206 and 408 of method 400. In the example of FIG. 6H, the telematic data includes the interpolated speed data generated in accordance with FIGS. 6A-6G discussed above. The interpolated video data is generated in accordance with act 206 of method 400 by interpolating the input video data in the same threshold time periods shown in FIGS. 6F and 6G. The data points included in the interpolated telematic data and video data are illustrated as black dots, and are not individually labelled to reduce clutter. The interpolated video data and interpolated telematic data are at the synchronized data rate, as in method 400.

As discussed earlier, in accordance with act 410 in method 400, the interpolated video data and the interpolated telematic data are sampled at the sample rate in the threshold time period (or threshold time periods). In the example of FIGS. 6G and 6H, the interpolated video data and the interpolated telematic data are sampled in time periods $P_1$, $P_2$, $P_3$, $P_4$, $P_5$, and $P_6$. Further as discussed earlier, in accordance with act 212 of method 400, the sampled video data and sampled telematic data are output as synchronized video and telematic data at the sample rate, for each of the above discussed time periods. Consequently, synchronized video and telematic data is generated at the sample rate, around each of data points 610, 622, 624, 626, 620, and 612. In this way, synchronized video and telematic data is generated around each inflection point in travel of the vehicle. Since each inflection point is more likely to represent a point of interest in the data (compared to other data points where the trajectory of the vehicle is unchanged), this synchronized data represents a meaningful and helpful balance, where quantity of data is generally reduced (by not reporting or keeping data unlikely to be of interest), but data density (frequency of data) is reported or maintained around times where such data is more likely to be of interest.

When three or more different sets of data are being synchronized in accordance with method 400 in FIG. 4, interpolation of each of the data sets (in acts 206, 408, or similar) can be performed for the threshold time period around each identified point from every data set. That is, for an identified data point in one of the data sets, interpolation for a threshold time period around a time of the identified data point is performed for each of the data sets.

While FIGS. 5A-5G and 6A-6H and the corresponding discussion pertain to telematic data including location data and/or speed data, the systems and methods herein are applicable to any appropriate telematic data, such as acceleration data, steering wheel input data, pedal input data (brake pedal and/or acceleration pedal), turn signal input data, or any other appropriate type of data.

In an example where the telematic data includes acceleration data, a telematic monitoring device (such as telematic monitoring device 104 discussed with reference to FIG. 1) captures the acceleration data indicating acceleration of a vehicle as the vehicle travels. The discussion of FIGS. 6A-6H is generally applicable to other data types, including acceleration data, and is not repeated for brevity. In an example where the telematic data includes acceleration data, a "difference" between a given data point and a reference line represents a difference in acceleration of the vehicle represented by the data point and represented by the reference line. In this way, selecting data points from the input telematic data for inclusion in the reduced telematic data, based on differences of the data points to iteratively-defined reference lines defined through portions of the input telematic data (as in act 420 of method 400) includes selecting data points from the input telematic data for inclusion in the reduced telematic data, based on differences in acceleration of the vehicle between accelerations represented by the data points to iteratively-defined reference lines defined through portions of the acceleration data.

More broadly, telematic data can include "motion data" captured by at least one motion sensor. Such motion sensors can include an inertial measurement unit, an accelerometer, or a gyroscope as example. Such motion data represents movement of the vehicle (e.g. speed, acceleration, or orientation), or movement of the vehicle can be derived based on motion data.

In an example where the telematic data includes driver input data (such as data representing pedal input, turn signal input, or other forms of driver input), a telematic monitoring device (such as telematic monitoring device 104 discussed with reference to FIG. 1) captures the driver input data indicating state of the driver input mechanism (e.g. pedal position, turn signal lever position). The discussion of FIGS. 6A-6H is generally applicable to driver input data, and is not repeated for brevity. In an example where the telematic data includes driver input data, a "difference" between a given data point and a reference line represents a difference in state of the input mechanism as represented by the data point and as represented by the reference line. In this way, selecting data points from the input telematic data for inclusion in the reduced telematic data, based on differences of the data points to iteratively-defined reference lines defined through portions of the input telematic data (as in act 420 of method 400) includes selecting data points from the input telematic data for inclusion in the reduced telematic data, based on differences in state of an input mechanism as represented by the data points to iteratively-defined reference lines defined through portions of the driver input data.

In some implementations, audio data may also be captured. For example, a telematic monitoring device (such as telematic monitoring device 104 discussed with reference to FIG. 1) can have an audio sensor (e.g. microphone) included therein which captures audio data in or around a vehicle). Alternatively, an image sensor (camera), such as image sensors 134 discussed with reference to FIG. 1, can have an audio sensor (e.g. microphone) included therein which captures audio data in or around a vehicle. Further alternatively, a separate audio sensor (e.g. microphone) can be positioned or installed at a vehicle, which captures audio data in or around the vehicle.

Like video data and telematic data, input audio data (captured audio data) can be accessed (similar to as in acts 202 of methods 200 and 400), interpolated to a synchronized data rate (similar to as in acts 206, 208, and 408 of methods 200 and 400), and sampled at a sampled data rate (similar to as in acts 210 and 410 of methods 200 and 400), to synchronize the audio data to other types of data. For audibility, audio data is commonly captured at a high data rate (e.g. above 1 kHz). In some implementations, the high data rate of audio data may already be significantly higher than data rates of other captured forms of data. In such implementations, the audio data rate can be set as the synchronized data rate, and the other types of data (video data and/or telematic data) can be interpolated up to match the audio data rate.

In some implementations, audio data can be grouped (conceptually or technically) together with the input telematic data, and can be interpolated together therewith (i.e. in acts 208 or 408).

While the present invention has been described with respect to the non-limiting embodiments, it is to be understood that the invention is not limited to the disclosed embodiments. Persons skilled in the art understand that the disclosed invention is intended to cover various modifications and equivalent arrangements included within the scope of the appended claims. Thus, the present invention should not be limited by any of the described embodiments.

Throughout this specification and the appended claims, infinitive verb forms are often used, such as "to operate" or "to couple". Unless context dictates otherwise, such infinitive verb forms are used in an open and inclusive manner, such as "to at least operate" or "to at least couple".

The Drawings are not necessarily to scale and may be illustrated by phantom lines, diagrammatic representations, and fragmentary views. In certain instances, details that are not necessary for an understanding of the exemplary embodiments or that render other details difficult to perceive may have been omitted.

The specification includes various implementations in the form of block diagrams, schematics, and flowcharts. A person of skill in the art will appreciate that any function or operation within such block diagrams, schematics, and flowcharts can be implemented by a wide range of hardware, software, firmware, or combination thereof. As non-limiting examples, the various embodiments herein can be implemented in one or more of: application-specific integrated circuits (ASICs), standard integrated circuits (ICs), programmable logic devices (PLDs), field-programmable gate arrays (FPGAs), computer programs executed by any number of computers or processors, programs executed by one or more control units or processor units, firmware, or any combination thereof.

The disclosure includes descriptions of several processors. Said processors can be implemented as any hardware capable of processing data, such as application-specific integrated circuits (ASICs), standard integrated circuits (ICs), programmable logic devices (PLDs), field-programmable gate arrays (FPGAs), logic circuits, or any other appropriate hardware. The disclosure also includes descriptions of several non-transitory processor-readable storage mediums. Said non-transitory processor-readable storage mediums can be implemented as any hardware capable of storing data, such as magnetic drives, flash drives, RAM, or any other appropriate data storage hardware. Further, mention of data or information being stored at a device (e.g. vehicle device 122 or network device 110) generally refers to the data information being stored at a non-transitory processor-readable storage medium of said device (e.g. non-transitory processor-readable storage mediums 116 or 126).

What is claimed is:

1. A method for synchronizing data, the method comprising:
   accessing input video data of a first data rate and input telematic data of at least a second data rate different from the first data rate;
   receiving an indication of a synchronized data rate;
   generating reduced telematic data, by selecting data points from the input telematic data for inclusion in the reduced telematic data, based on differences of the data points to iteratively-defined reference lines defined through portions of the input telematic data;
   generating interpolated video data by interpolating the input video data at the synchronized data rate for a threshold time period around each identified data point in the input telematic data;
   generating interpolated telematic data by interpolating the reduced telematic data at the synchronized data rate for the threshold time period around each identified data point in the input telematic data; and
   sampling the interpolated telematic data and the interpolated video data at a sample rate in the threshold time period.

2. The method of claim 1, wherein selecting data points from the input telematic data for inclusion in the reduced telematic data, based on differences of the data points to iteratively-defined reference lines defined through portions of the input telematic data, comprises, for each data point of the input telematic data:
   determining a minimum difference between the data point and a corresponding reference line of the iteratively-defined reference lines, where the data point is included in the reduced telematic data if the minimum difference between the data point and the corresponding reference line exceeds a difference threshold.

3. The method of claim 1, wherein selecting data points from the input telematic data for inclusion in the reduced telematic data, based on differences of the data points to iteratively-defined reference lines defined through portions of the input telematic data, comprises:
   defining a reference line through the input telematic data;
   identifying a data point of the input telematic data, where a minimum difference between the data point and the reference line is greater than a minimum difference between other data points and the reference line; and
   if the minimum difference between the data point and the reference line exceeds a difference threshold:
      selecting the data point for inclusion in the reduced telematic data; and
      defining new reference lines which intersect the selected data point through the input telematic data.

4. The method of claim 3, wherein selecting data points from the input telematic data for inclusion in the reduced telematic data, based on differences of the data points to iteratively-defined reference lines defined through portions of the input telematic data, further comprises:
   defining an additional reference line through the input telematic data which intersects a data point previously selected for inclusion in the reduced telematic data;
   identifying an additional data point of the input telematic data, where a minimum difference between the additional data point and the additional reference line is greater than a minimum difference between other data points and the additional reference line; and
   if the minimum difference between the additional data point and the additional reference line exceeds the difference threshold:
      selecting the additional data point for inclusion in the reduced telematic data.

5. The method of claim 1, wherein the input telematic data includes location data for a vehicle, and selecting data points from the input telematic data for inclusion in the reduced telematic data, based on differences of the data points to iteratively-defined reference lines defined through portions of the input telematic data comprises:
   selecting data points from the input telematic data for inclusion in the reduced telematic data, based on physical distances between positions represented by the data points to iteratively-defined reference lines defined through portions of the location data.

6. The method of claim 1, wherein the input telematic data includes speed data for a vehicle, and selecting data points from the input telematic data for inclusion in the reduced telematic data, based on differences of the data points to iteratively-defined reference lines defined through portions of the input telematic data comprises:
   selecting data points from the input telematic data for inclusion in the reduced telematic data, based on differences in speed between speeds represented by the data points to iteratively-defined reference lines defined through portions of the speed data.

7. The method of claim 1, wherein the input telematic data includes acceleration data for a vehicle, and selecting data points from the input telematic data for inclusion in the reduced telematic data, based on differences of the data points to iteratively-defined reference lines defined through portions of the input telematic data comprises:
   selecting data points from the input telematic data for inclusion in the reduced telematic data, based on differences in acceleration between accelerations represented by the data points to iteratively-defined reference lines defined through portions of the acceleration data.

8. The method of claim 1, further comprising receiving an indication of the threshold time period.

9. A system for synchronizing data, the system comprising:
   at least one processor;
   at least one non-transitory processor-readable storage medium communicatively coupled to the at least one processor and storing processor-executable instructions which when executed by the at least one processor cause the system to:
      access, by the at least one processor, input video data of a first data rate and input telematic data of at least a second data rate different from the first data rate;
      receive, by the at least one processor, an indication of a synchronized data rate;
      generate, by the at least one processor, reduced telematic data, by selecting data points from the input telematic data for inclusion in the reduced telematic data, based on differences of the data points to iteratively-defined reference lines defined through portions of the input telematic data;

generate, by the at least one processor, interpolated video data by interpolating the input video data at the synchronized data rate for a threshold time period around each identified data point in the input telematic data;

generate, by the at least one processor, interpolated telematic data by interpolating the reduced telematic data at the synchronized data rate for the threshold time period around each identified data point in the input telematic data;

sample, by the at least one processor, the interpolated telematic data and the interpolated video data at a sample rate in the threshold time period; and store, by the at least one processor, the sampled video data and sampled telematic data as synchronized video and telematic data.

10. The system of claim 9, wherein the processor-executable instructions which cause the at least one processor to select data points from the input telematic data for inclusion in the reduced telematic data, based on differences of the data points to iteratively-defined reference lines defined through portions of the input telematic data, cause the at least one processor to, for each data point of the input telematic data:

determine a minimum difference between the data point and a corresponding reference line of the iteratively-defined reference lines, where the data point is included in the reduced telematic data if the minimum difference between the data point and the corresponding reference line exceeds a difference threshold.

11. The system of claim 9, wherein the processor-executable instructions which cause the at least one processor to select data points from the input telematic data for inclusion in the reduced telematic data, based on differences of the data points to iteratively-defined reference lines defined through portions of the input telematic data, cause the at least one processor to:

define a reference line through the input telematic data;

identify a data point of the input telematic data, where a minimum difference between the data point and the reference line is greater than a minimum difference between other data points and the reference line; and if the minimum difference between the data point and the reference line exceeds a difference threshold:
select the data point for inclusion in the reduced telematic data; and
define new reference lines which intersect the selected data point through the input telematic data.

12. The system of claim 11, wherein the processor-executable instructions which cause the at least one processor to select data points from the input telematic data for inclusion in the reduced telematic data, based on differences of the data points to iteratively-defined reference lines defined through portions of the input telematic data, further cause the at least one processor to:

define an additional reference line through the input telematic data which intersects a data point previously selected for inclusion in the reduced telematic data;

identify an additional data point of the input telematic data, where a minimum difference between the additional data point and the additional reference line is greater than a minimum difference between other data points and the additional reference line; and if the minimum difference between the additional data point and the additional reference line exceeds the difference threshold: select the additional data point for inclusion in the reduced telematic data.

13. The system of claim 9, wherein the input telematic data includes location data for a vehicle, and the processor-executable instructions which cause the at least one processor to select data points from the input telematic data for inclusion in the reduced telematic data, based on differences of the data points to iteratively-defined reference lines defined through portions of the input telematic data, cause the at least one processor to:

select data points from the input telematic data for inclusion in the reduced telematic data, based on physical distances between positions represented by the data points to iteratively-defined reference lines defined through portions of the location data.

14. The system of claim 9, wherein the input telematic data includes speed data for a vehicle, and the processor-executable instructions which cause the at least one processor to select data points from the input telematic data for inclusion in the reduced telematic data, based on differences of the data points to iteratively-defined reference lines defined through portions of the input telematic data, cause the at least one processor to:

select data points from the input telematic data for inclusion in the reduced telematic data, based on differences in speed between speeds represented by the data points to iteratively-defined reference lines defined through portions of the speed data.

15. The system of claim 9, wherein the input telematic data includes acceleration data for a vehicle, and the processor-executable instructions which cause the at least one processor to select data points from the input telematic data for inclusion in the reduced telematic data, based on differences of the data points to iteratively-defined reference lines defined through portions of the input telematic data, cause the at least one processor to:

select data points from the input telematic data for inclusion in the reduced telematic data, based on differences in acceleration between accelerations represented by the data points to iteratively-defined reference lines defined through portions of the acceleration data.

16. The system of claim 9, further comprising a user input device for receiving an indication of the threshold time period.

* * * * *